US012636872B2

(12) United States Patent
Brueckner et al.

(10) Patent No.: US 12,636,872 B2
(45) Date of Patent: May 26, 2026

(54) ARTICLE AND METHOD FOR TEMPORARY BONDING OF SUBSTRATES

(71) Applicant: CORNING INCORPORATED, Corning, NY (US)

(72) Inventors: Julia Anne Dorothee Brueckner, Nieder-Olm (DE); Ya-Huei Chang, Zhudong Township (TW); Kuan-Ting Kuo, Chubei (TW); Prantik Mazumder, Ithaca, NY (US); Jian-Zhi Jay Zhang, Ithaca, NY (US)

(73) Assignee: CORNING INCORPORATED, Corning, NY (US)

( * ) Notice: Subject to any disclaimer, the term of this patent is extended or adjusted under 35 U.S.C. 154(b) by 41 days.

(21) Appl. No.: 18/389,252

(22) Filed: Nov. 14, 2023

(65) Prior Publication Data

US 2024/0208198 A1 Jun. 27, 2024

Related U.S. Application Data

(60) Provisional application No. 63/432,486, filed on Dec. 14, 2022.

(51) Int. Cl.
*B32B 43/00* (2006.01)
*B32B 7/12* (2006.01)
(Continued)

(52) U.S. Cl.
CPC .............. *B32B 43/006* (2013.01); *B32B 7/12* (2013.01); *B32B 17/06* (2013.01); *H10P 72/74* (2026.01)

(58) Field of Classification Search
CPC ......... B32B 43/006; B32B 7/12; B32B 17/06; B32B 27/16; B32B 27/281;
(Continued)

(56) References Cited

U.S. PATENT DOCUMENTS 9,827,740 B2 11/2017 Liu et al.
2018/0102333 A1 4/2018 Yasuda et al.
(Continued)

FOREIGN PATENT DOCUMENTS

CN 108603028 A 9/2018

OTHER PUBLICATIONS

Fowler et al., "Dual-Carrier Process Using Mechanical and Laser Release Technologies for Advanced Wafer-Level Packaging", IEEE 68th Electronic Components and Technology Conference, 2018, 6 pages.

(Continued)

*Primary Examiner* — Patricia L. Nordmeyer
(74) *Attorney, Agent, or Firm* — Kevin L. Bray; Ye Eun Park

(57) ABSTRACT

Articles and methods for temporary bonding of substrates are described. The articles include a photo-release layer to enable reversal of the temporary bonding upon exposure of the photo-release layer to light to separate the substrates. The method includes plasma treatment of the photo-release layer to increase the bonding energy. Higher bonding energy allows for processing of the article with greater mechanical force before separation. Plasma treatment also allows for temporary bonding with a thinner photo-release layer and a photo-release layer with low total thickness variation (TTV). Once separated from the article, a processed substrate can be bonded to other substrates.

14 Claims, 11 Drawing Sheets

(51) Int. Cl.
*B32B 17/06* (2006.01)
*H10P 72/70* (2026.01)

(58) Field of Classification Search
CPC ......... B32B 2307/7376; H01L 21/6835; H01L 2221/68327; H03H 3/08; H03H 9/02574; H10N 30/072; H10N 30/80; C03C 27/10
See application file for complete search history.

(56) References Cited

U.S. PATENT DOCUMENTS

| | | | | |
|---|---|---|---|---|
| 2018/0277472 | A1* | 9/2018 | Yasuda ................ | C09D 161/12 |
| 2020/0091371 | A1* | 3/2020 | Atanackovic .......... | H10H 20/81 |
| 2021/0261836 | A1 | 8/2021 | Bhattacharyya et al. | |
| 2022/0140227 | A1 | 5/2022 | Bhattacharyya et al. | |

OTHER PUBLICATIONS

International Search Report and Written Opinion of the International Searching Authority; PCT/US2023/082431; dated Apr. 16, 2024; 17 pages; European Patent Office.
Jeon et al., “Thin Si wafer substrate bonding and de-bonding below 250° C. for the monolithic 3D integration”, Sensors and Actuators A: Physical, vol. 281, 2018, pp. 222-228.
Xiao et al., “Temporary Wafer Bonding Materials with Mechanical and Laser Debonding Technologies for Semiconductor Device Processing”, IMAPS 2016—49th International Symposium on Microelectronics, 6 pages.
Gosele, et al. “Semiconductor Wafer Bonding”, Annual Reviews of Materials Science, vol. 28, No. 1. pp. 215-241, 1998.

* cited by examiner $$TTV = T_{max} - T_{min}$$

ARTICLE AND METHOD FOR TEMPORARY BONDING OF SUBSTRATES

This application claims the benefit of priority under 35 U.S.C. § 120 of U.S. Provisional Application Ser. No. 63/432,486 filed on Dec. 14, 2022, the content of which is relied upon and incorporated herein by reference in its entirety.

FIELD OF THE DISCLOSURE

The present disclosure is generally directed to an article for temporary bonding of substrates, and more particularly to an article that includes a processing substrate temporarily bonded to a support substrate with a bonding structure that permits separation of the working substrate from the support substrate with light, as well as to methods of using the article to process the working substrate.

BACKGROUND OF THE DISCLOSURE

Techniques for processing substrates to meet dimensional or performance requirements are essential to modern industry. Processing techniques include chemical or physical treatments and require precise control of the positioning and motion of the substrate. Established substrate handling techniques are available for substrates having large physical dimensions. As substrate dimensions become smaller, processing becomes more difficult, especially when tight tolerances are required.

A common substrate processing technique is thinning, a process in which a physical dimension of the substrate is reduced. The thinning of a substrate to a very small thickness, for example 10 microns or less, is difficult to complete through direct processing of the substrate. Thin freestanding substrates, for example, are susceptible to fracture and are difficult to handle. Instead, processes in which substrates are thinned to micron-scale dimensions typically utilize a supporting member during the thinning process. In these processes, the substrate to be thinned ("working substrate") is bonded to a supporting member ("support substrate"). The support substrate is mechanically robust and allows for processing of the working substrate to or at small thicknesses without damage. The working substrate is attached to the support substrate with a bonding material. The bonding material adheres or joins the working substrate to the support substrate through a chemical or physical bonding mechanism and provides sufficient bonding energy to secure the working substrate to the support substrate to permit processing of the working substrate while it is bonded to the support substrate.

In typical applications, the objective of processing is to provide a product consisting of the combination of the support substrate and processed working substrate. Most commonly, the support substrate is a semiconductor, the processed working substrate is a thin electronic, photonic, or piezoelectric material that optically, electrically, or piezoelectrically interacts with the semiconductor, and the combination of the semiconductor and thin electronic, photonic or piezo-electrical material is the desired final product.

As applications expand, however, the requirements for the performance and characteristics of the processed working substrate are becoming increasingly demanding. In addition to small thickness, for example, it is often desirable for the thickness of the processed working substrate to be highly uniform across the processed working substrate. Uniformity of thickness is normally characterized as the total thickness variation (TTV) of the working substrate, where a low total thickness variation (TTV) corresponds to high uniformity of thickness. When conventional thinning techniques are used, the total thickness variation (TTV) of the thinned working substrate depends on the total thickness variation (TTV) of the support substrate. In order to achieve a low total thickness variation (TTV) for the thinned working substrate, the support substrate must have a low total thickness variation (TTV).

While it is possible to configure most support substrates to have a low total thickness variation (TTV), it is often impractical or inconvenient to do so. When the support substrate is a semiconductor or device wafer, for example, the processing needed to achieve a low total thickness variation (TTV) for the support substrate is complex, time consuming, and expensive. As a result, alternative processing techniques for achieving thinned working substrates with low total thickness variation (TTV) are under development.

One alternative technique is a transfer technique in which the working substrate is temporarily bonded to a carrier substrate, processed on the carrier substrate to a state of low total thickness variation (TTV), transferred and bonded to a support substrate, and separated from the carrier substrate to provide a final product in which the processed working substrate is bonded to the support substrate. The material selected for the carrier substrate is a material that can be configured to low or ultralow total thickness variation (TTV) using simple and inexpensive techniques. The carrier substrate constitutes an intermediate substrate in the formation of the final product.

The working substrate is attached to the carrier substrate with a temporary bonding structure that provides sufficient bonding strength to secure the working substrate to the carrier substrate during processing. The temporary bonding structure includes one or more layers and is designed to reversibly bond the working substate to the carrier substrate. To make the final product, it is necessary to bond a support substrate to the working substrate and to separate the thinned working substrate from the carrier substrate.

Successful implementation of transfer techniques requires a simple and effective means of reversing the temporary bond provided by the temporary bonding structure to separate the working substrate from the carrier substrate. The separation techniques currently used in transfer techniques were developed for the temporary bonding of thick working substrates on carrier substrates. These techniques rely on mechanical separation in which the temporary bonding structure is fractured with mechanical force (e.g. by applying a blade) to release the working substrate from the carrier substrate. Mechanical separation becomes increasingly problematic, however, as the thickness of the working substrate decreases because the application of mechanical force to the temporary bonding structure damages the working substrate. In addition, throughput of mechanical separation is below 25 wafers per hour, which is twice lower than that of laser or light separation Temporary bonding structures amenable to reversal of bonding and separation upon illumination by light are also known. Mechanical separation force is not used in the illumination techniques. Instead, a light source (e.g, laser, diode, or lamp) is used to ablate, decompose, transform, or react the temporary bonding structure through a photochemical, photophysical, or photothermal process that weakens or reverses the temporary bond to enable release of the working substrate from the support substrate. Relatively few temporary bonding structures, however, are amenable to separation with light and the ones that are known require a thickness of at least 10 microns to provide the strength of temporary bonding needed to secure the working substrate to the carrier substrate with sufficient strength to maintain a fixed position of the working substrate when it is subjected to the mechanical force (e.g. grinding) needed to process (e.g. thin) the working substrate.

A large thickness for the temporary bonding structure is undesirable in applications that require thinned working substrates with low total thickness variation (TTV) because the total thickness variation (TTV) of the temporary bonding structure increases with thickness. A high total thickness variation (TTV) of the temporary bonding structure leads to an increase in the total thickness variation (TTV) of the working substrate after thinning even when the total thickness variation (TTV) of the carrier substrate is low. Low total thickness variation (TTV) is not readily achievable in thin temporary bonding structures that require temporary bonding structures providing strong bonding of the working substrate to the carrier substrate.

Accordingly, there is a need for a thin temporary bonding structure that (1) is amenable to separation with light and (2) provides a high strength of temporary bonding of the working substrate to carrier substrate. There is further a need for articles that include such temporary bonding structures in combination with carrier substrates and working substrates, as well as methods of making and using such articles.

SUMMARY OF THE DISCLOSURE

The present disclosure provides a temporary bonding structure capable of reversibly bonding a working substrate to a carrier substrate. The bonding of the temporary bonding structure (1) is reversible upon exposure of the temporary bonding structure to light; (2) is thin with a low total thickness variation (TTV); and (3) provides sufficient bonding energy of the support substrate to the working substrate to rigidly secure the working substrate to the carrier substrate to permit thinning, grinding, polishing, and other mechanical processing of the working substrate.

The present disclosure extends to:

An article comprising:

a first substrate;

a second substrate;

a bonding structure disposed between and in direct contact with the first substrate and the second substrate, the bonding structure having an average thickness less than 10.0 microns and providing a bonding energy of the second substrate to the first substrate greater than 200 $mJ/m^2$, the bonding structure comprising a photo-release layer, the photo-release layer having an extinction coefficient greater than 0.010 at a wavelength in the range from 190 nm to 700 nm.

The present disclosure extends to:

A method for forming an article comprising:

treating a photo-release layer disposed on a first substrate with a plasma, the photo-release layer having an extinction coefficient greater than 0.010 at a wavelength in the range from 190 nm to 700 nm.

According to one embodiment, an article is provided. The article comprises a support unit comprising a support substrate having a surface and a bonding layer bonded to the surface of the support substrate. Furthermore, a total thickness variation (TTV) across a width of the support unit is about 2.0 microns or less.

According to another embodiment, an article is provided. The article comprises a support unit comprising a support substrate having a surface and a bonding layer bonded to the surface of the support substrate. A total thickness variation (TTV) across a width of the support unit is about 2.0 microns or less. Additionally, the article comprises a first substrate and a device support wafer. The bonding layer couples the support substrate with the first substrate, and the device support wafer is removably coupled with the support substrate.

According to another embodiment, a method of providing a thin substrate using a support unit is provided. The method comprises bonding a first substrate to a support substrate with a bonding layer. The support substrate and the bonding layer forming a support unit having a total thickness variation (TTV) across a width of the support unit of about 2.0 microns or less.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
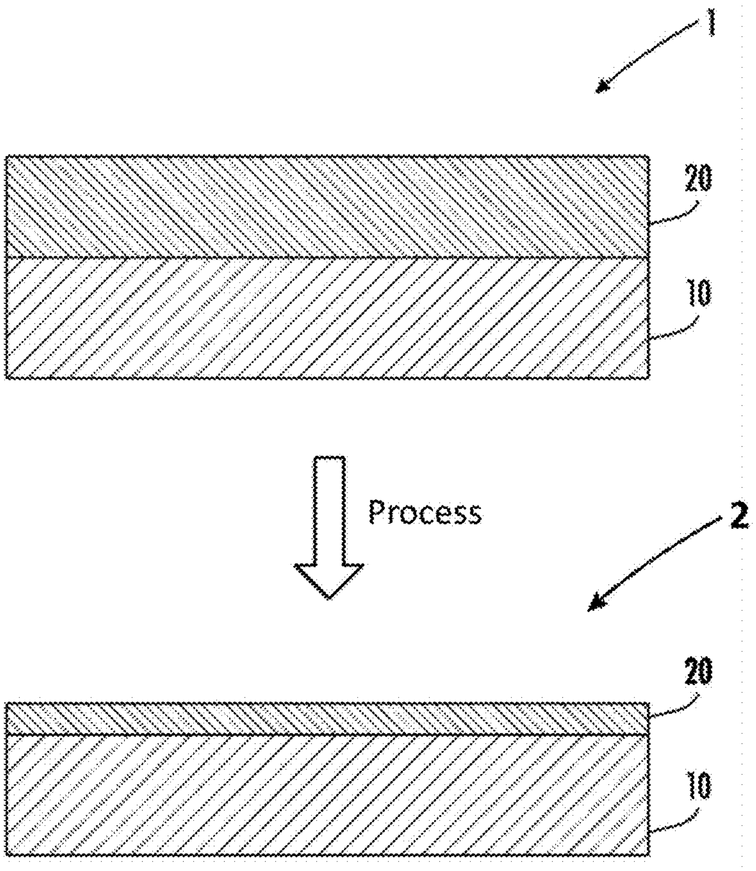
FIG. 1 is a schematic diagram illustrating a process of thinning a working substrate on a support substrate.

Additional features and advantages of the disclosure will be set forth in the detailed description which follows and will be apparent to those skilled in the art from the description, or recognized by practicing the disclosure as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

Directional terms as used herein—for example up, down, right, left, front, back, top, bottom—are made only with reference to the figures as drawn and are not intended to imply absolute orientation.

The indefinite article "a" or "an" and its corresponding definite article "the" as used herein means at least one, or one or more, unless specified otherwise. The term "plurality" means two or more.

The indefinite articles "a" and "an" when used to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

As used herein, "comprising" is an open-ended transitional phrase. A list of elements following the transitional phrase "comprising" is a non-exclusive list, such that elements in addition to those specifically recited in the list may also be present.

The terms "comprising," and "comprises," e.g., "A comprises B," is intended to include as special cases the concepts of "consisting of" and "consisting essentially of" as in "A consists of B" and "A consists essentially of B".

The term "or," as used herein, is inclusive; more specifically, the phrase "A or B" means "A, B, or both A and B." Exclusive "or" is designated herein by terms such as "either A or B" and "one of A or B," for example.

The term "formed from" can mean one or more of comprises, consists essentially of, or consists of. For example, a component that is formed from a particular material can comprise the particular material, consist essentially of the particular material, or consist of the particular material.

The term "layer" refers to a homogeneous, compositionally uniform region of material.

As used herein, contact refers to direct contact or indirect contact. Direct contact refers to contact in the absence of an intervening material and indirect contact refers to contact through one or more intervening materials. The term "intervening material" refers to a solid or liquid medium. Elements in direct contact touch each other. Elements in indirect contact do not touch each other, but do touch an intervening material or one of a series of intervening materials that continuously fill the space between the elements. Elements in contact may be rigidly or non-rigidly (flexibly) joined. Contacting refers to placing two elements in direct or indirect contact. Elements in direct (indirect) contact may be said to directly (indirectly) contact each other.

As used herein, the terms "disposed on" or "on" mean in direct or indirect contact. A layer disposed on (or on) a surface, for example, is in direct or indirect contact with the surface. A layer in direct contact with a surface is said to be "directly disposed on" or "directly on".

Surface roughness reported herein refers to the roughness $R_a$ or roughness $R_q$ as measured by AFM (Atomic Force Microscopy). Measurements were made at center, edge, and midway (halfway between center and edge) positions of the carrier substrate, bonding structure, and working substrate. For purposes of surface roughness measurements, edge position refers to a position 2 mm away from the outside boundary of the surface being measured. The area of measurement was 2×2 $\mu m^2$ for working substrates, and 5×5 $\mu m^2$ or 20×20 $\mu m^2$ for carrier substrates and bonding structures Unless otherwise expressly stated, it is in no way intended that any method set forth herein be construed as requiring that its steps be performed in a specific order, nor that with any apparatus, specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

It is also important to note that the construction and arrangement of the elements of the disclosure, as shown in the exemplary embodiments, is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel and nonobvious teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present disclosure. Other substitutions, modifications, changes, and omissions may be made in the design, operating conditions, and arrangement of the desired and other exemplary embodiments without departing from the spirit of the present disclosure.

Reference will now be made in detail to the present preferred embodiments of the disclosure, examples of which are illustrated in the accompanying drawings. Whenever possible, the same reference numbers will be used throughout the drawings to refer to the same or like parts.

FIG. 1 shows an exemplary process to provide an article 1 in which a working substrate 20 is bonded to a support substrate 10 and the working substrate 20 is processed (e.g. thinned by grinding or polishing) to form a final product 2. Conventionally, the object of processing is to produce final product 2 and working substrate 20 is permanently bonded to support substrate 10. The permanent bond rigidly secures working substrate 20 to support substrate 10 during processing and in final product 2.

Figure 2A:
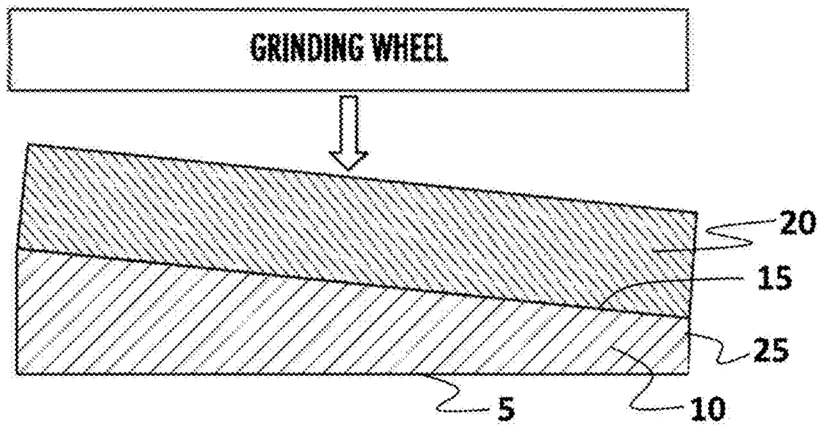
FIGS. 2A and 2B are schematic diagrams illustrating a process of thinning a working substrate on a support substrate with non-uniform thickness.
Figure 2B:
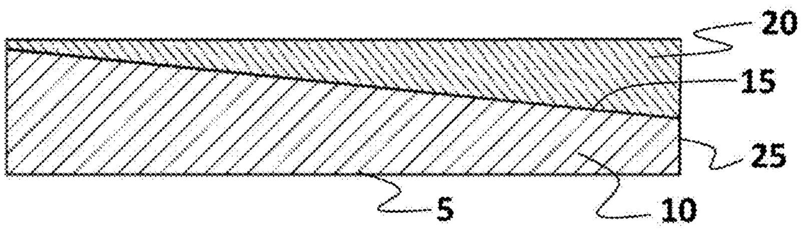

When the process objective is a final product 2 in which thinned working substrate 20 has low total thickness variation (TTV), support substate 10 needs have low total thickness variation (TTV). There is a correlation between the total thickness variation (TTV) of support substrate 10 and the total thickness variation (TTV) attainable by processing of working substrate 20. FIGS. 2A and 2B illustrate the effect of thickness variation in support substrate 10 on thickness variation in working substrate 20. Support substrate 10 exhibits a variation in thickness across its dimensions. Thickness refers to the distance between top surface 15 and bottom surface 5 of support substrate 10 measured in the direction perpendicular to bottom surface 5. Top surface 15 of support substrate 10 is the surface of support substrate 10 that directly contacts working substrate 20 and bottom surface 5 of support substrate 10 opposes top surface 15. Top surface 15 and bottom surface 5 may also be referred to as opposing surfaces and are joined by an edge surface 25. The thickness variation shown in FIGS. 2A and 2B is exaggerated for purposes of illustration and is typically on the order of several microns or more for commonly available support substrates 10. Working substrate 20 is permanently bonded to support substrate 10 and is subjected to thinning in a process using a grinding wheel. The reference surface for thinning is typically the surface upon which support substrate 10 rests during processing (bottom surface 5) and the working surface of the grinding wheel is parallel to the reference surface. When the grinding wheel is lowered towards working substrate 20, it will initially contact the raised portion of working substrate 20 and continue by processing progressively lower portions of working substrate 20. The net result is a working substrate 20 that has a thickness variation that is comparable to the thickness variation in support substrate 10.

In order to process working substrate 20 to achieve low total thickness variation (TTV), it is necessary for support substrate 10 to have a low total thickness variation (TTV). To achieve low total thickness variation (TTV), support substrate 10 typically needs to be subjected to a pre-treatment process before working substrate 20 is bonded to it. When support substrate 10 is a semiconductor or device wafer, as is often desired for final product 2, the pre-treatment process is expensive and time consuming.

The disclosure that follows describes articles and methods in which a working substrate is temporarily bonded to a carrier substrate and processed to provide an article and working substrate with low total thickness variation (TTV). The carrier substrate is selected on the basis of the convenience by which it can be configured to have low total thickness variation (TTV) so that expensive pre-treatment processes can be avoided. The carrier substrate is utilized for processing the working substrate to reduce its total thickness variation (TTV) and is a transitional support in the sense that it need not be a desired product element. Once the working substrate is processed to a desired total thickness variation (TTV), a support substrate is bonded to the processed surface of the working substrate, the temporary bonding of the working substrate to the carrier substrate is reversed, and the working substrate is separated from the carrier substrate to provide a product in which the working substrate with low total thickness variation (TTV) is bonded to the support substrate. An advantage of this process is that the support substrate need not have low total thickness variation (TTV). To the contrary, the support substrate can have a total thickness variation (TTV) that is greater than the total thickness variation (TTV) of the working substrate. As a result, products requiring bonding of a working substrate with low total thickness variation (TTV) to a support substrate that is difficult to configure with low total thickness variation (TTV) can be formed without subject the support substrate to expensive pre-treatment procedures.

Figure 3:
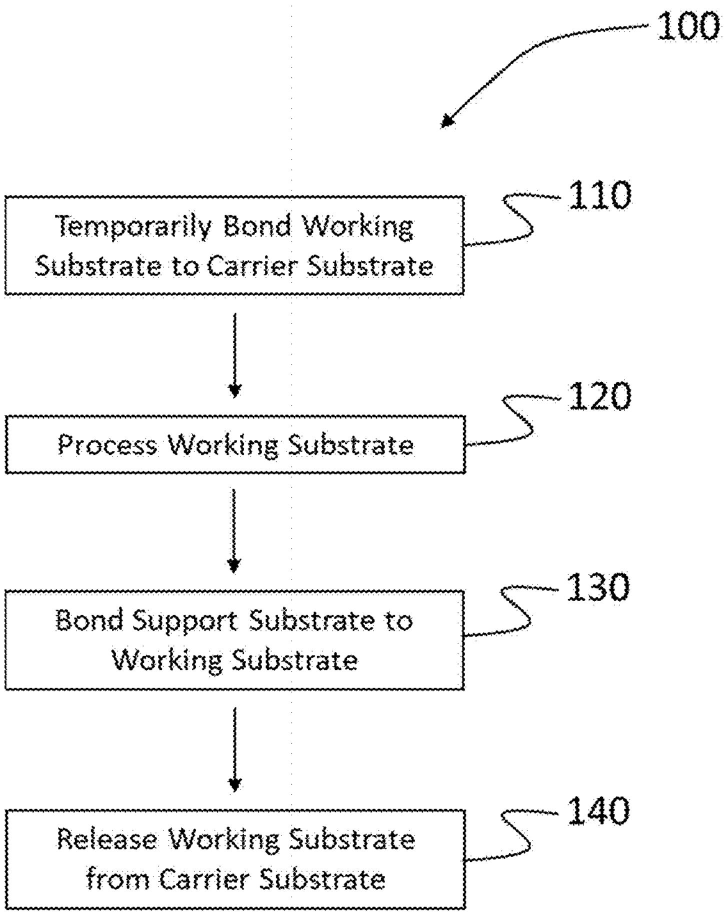
FIG. 3 is a flow chart illustrating a process to form an article according to embodiments of the present disclosure.

Referring now to FIG. 3, a process 100 is shown, according to embodiments of the present disclosure, of processing a working substrate that is temporarily bonded to a carrier substrate. At step 110, the process comprises temporarily bonding a working substrate to a carrier substrate. As discussed further below, the temporary bond is formed with a bonding structure having a low total thickness variation. The bonding structure provides a uniform and flat surface and has a thickness much smaller than the thickness of the carrier substrate. The working substrate is processed at step 120. Preferably, processing includes reducing the thickness of the working substrate. Methods of thinning the working substrate include chemical or mechanical processes, or combinations thereof, such as grinding, polishing, abrasion, chemical mechanical planarization (CMP), ion-beam milling, plasma etching, and wet etching. Processing may also include treatment of the surface of the working substrate.

A support substrate is bonded to the working substrate at step 130. Bonding occurs at the surface of the working substrate that was processed in step 120. Preferably, the bonding between the support substrate and the working substrate is permanent. At step 140, the working substrate is separated from the carrier substrate by breaking the temporary bond between the working substrate and the carrier substrate. The outcome of step 140 is an article that includes the processed working substrate bonded to the support substrate. Optionally, the article formed at step 140 may be subjected to further downstream processing (e.g. layer deposition on or treatment of exposed surfaces of the working substrate and/or support substrate).

Figure 4:
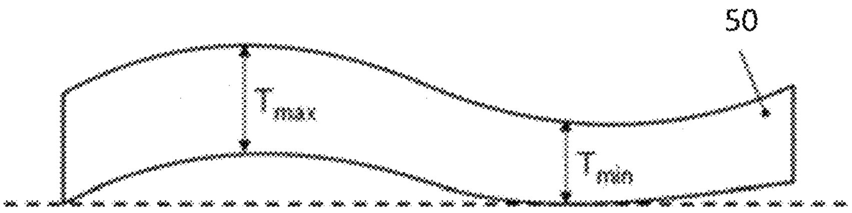
FIG. 4 is an edge view of an exemplary substrate exhibiting thickness deviations, and illustrating measurement of total thickness variation (TTV)

Uniformity in thickness is an important attribute of substrates in many applications. One or more of the carrier substrate, bonding structure, working substrate, and support substrate has a low total thickness variation. As used herein, total thickness variation (TTV) refers to the difference between the maximum thickness and the minimum thickness of a substrate (or bonding structure) over the entire area of the substrate (or bonding structure). When determining total thickness variation (TTV), the substrate (or bonding structure) is held in an unclamped (free) state. FIG. 4 provides an exemplary substrate 50 exhibiting thickness deviations and illustrating the total thickness variation (TTV) measurement. As shown in FIG. 4, total thickness variation (TTV) in this exemplary substrate is the difference between the maximum thickness $T_{max}$ and the minimum thickness $T_{min}$ of the unclamped substrate 50 over the area A. It is noted that the TTV of a substrate is distinguished from the bow or the warp (flatness) of the substrate. Total thickness variation (TTV) of carrier substrates, working substrates, and support substrates for purposes of the present disclosure is determined by frequency stepping interferometry using a Tropel® FlatMaster® MSP-300 Glass Wafer Analysis System (available from Corning Incorporated) or equivalent instrument. Total thickness variation (TTV) of the bonding structure is determined by scanning electron microscopy.

Figure 5:
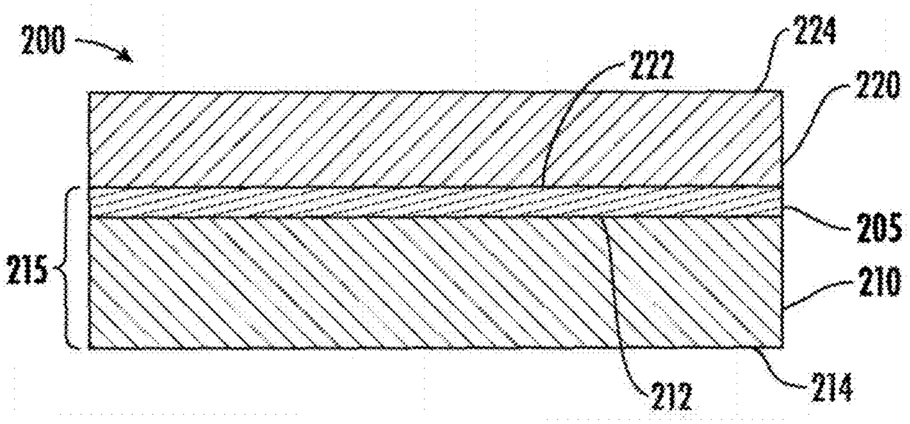
FIG. 5 depicts a cross-sectional view of an article that includes a carrier substrate, a bonding structure, and a working substrate.

Referring again to FIG. 3, at step 110, a working substrate is bonded to a carrier substrate. As shown in FIG. 5, an article 200 comprising an exemplary carrier substrate 210 bonded to a working substrate 220 with bonding structure 205 is shown. Carrier substrate 210 comprises first surface 212 and second surface 214. First surface 212 and second surface 214 are opposing surfaces that define the thickness of carrier substrate 210. Working substrate 220 comprises first surface 222 and second surface 224. First surface 222 and second surface 224 are opposing surfaces that define the thickness of working substrate 220. First surface 212 of carrier substrate 210 is bonded to first surface 222 of substrate 220 with bonding structure 205. Bonding structure 205 is in direct contact with carrier substrate 210 and working substrate 220. Bonding structure 205 provides a temporary bond between carrier substrate 210 and working substrate 220. The temporary bond that may be broken through exposure to light, as discussed further below, to enable separation of working substrate 220 and carrier substrate 210. Carrier substrate 210 provides a stable platform for the processing of second surface 224 of working substrate 220. For example, thinning of working substrate 220 occurs by grinding, polishing, abrading or otherwise removing material from second surface 224. Carrier substrate 210 and bonding structure 205 together form a support unit 215.

Carrier substrate 210 may be comprised of glass or glass ceramic such as, for example, silicate glass, an aluminosilicate glass, alkali aluminosilicate glass, alkaline earth aluminosilicate glass, borosilicate glass, boro-aluminosilicate glass, alkali aluminoborosilicate glass, alkaline earth aluminoborosilicate glass, soda-lime glass, fused quartz (fused silica), or other types of glass. Exemplary glass substrates include, but are not limited to, HPFS® ArF Grade Fused Silica sold by Corning Incorporated of Corning, New York under glass codes 7980, 7979, and 8655; Corning® carrier glasses sold by Corning Incorporated of Corning, New York under glass codes SG3.4, SG7.8, and SG9.0; and Corning® EAGLE XG® Glass, e.g., boro-aluminosilicate glass also sold by Corning Incorporated of Corning, New York. Other glass substrates include, but are not limited to, Corning Lotus™ NXT Glass, Corning Iris™ Glass, Corning® WILLOW® Glass, Corning® Gorilla® Glass, Corning VALOR® Glass, or PYREX® Glass sold by Corning Incorporated of Corning, New York. In some embodiments, the glass or glass ceramic has 50 wt. % or more, 60 wt. % or more, 70 wt. % or more, 80 wt. % or more, 90 wt. % or more, or 95 wt. % or more silica content by weight on an oxide basis. In other embodiments, carrier substrate 210 is comprised of ceramic or a semiconductor, such as silicon. Preferably, the coefficient of thermal expansion of carrier substrate matches or closely to the coefficient of thermal expansion of support substrate.

In some embodiments, carrier substrate 210 has an average thickness in a range from about 0.1 mm to about 5.0 mm, or from about 0.2 mm to about 2.0 mm, or from about 0.3 mm to about 1.0 mm. Carrier substrate 210 should be sufficiently thick so that it remains rigid without bending or flexing during the processing of working substrate 220.

Carrier substrate 210 may have or be pre-treated to have a low total thickness variation (TTV) before bonding to working substrate 220 with bonding structure 205. The total thickness variation (TTV) of carrier substrate 210 is less than 3.0 microns, or less than 2.5 microns, or less than 2.0 microns, or less than 1.7 microns, or less than 1.5 microns, or less than 1.2 microns, or less than 1.0 microns, or less than 0.7 microns, or less than 0.5 microns, or less than 0.3 microns, or less than 0.2 microns, or less than 0.1 microns, or less than 0.05 microns, or in a range from 0.05 microns to 2.0 microns, or in a range from 0.1 microns to 1.5 microns, or in a range from 0.1 microns to 1.0 microns, or in a range from 0.1 microns to 0.8 microns, or in a range from 0.1 microns to 0.5 microns.

In embodiments, first surface 212 of carrier substrate 210 has a low surface roughness $R_a$. Without wishing to be bound by theory, it is thought that a low roughness of first surface 212 allows for a reduction in the average thickness of bonding structure 205, which in turn leads to a reduction in total thickness variation (TTV) of bonding structure 205 (see below). In embodiments, first surface 212 of carrier substrate 210 has a surface roughness $R_a$ of less than 2.00 nm, or less than 1.50 nm, or less than 1.00 nm, or less than 0.50 nm, or less than 0.25 nm or less, or in a range from 0.10 nm to 2.00 nm, or in a range from 0.30 nm to 1.70 nm, or in a range from 0.50 nm to 1.60 nm, or in a range from 0.70 nm to 1.50 nm, or in a range from 0.90 nm to 1.40 nm.

Working substrate 220, in some embodiments, comprises a piezoelectric material including, for example, lithium tantalate ($LiTaO_3$), lithium niobate ($LiNbO_3$), aluminum nitride (AlN), and/or lead zirconate titanate (PZT) ($Pb[Zr_xTi_{1-x}]O_3$ ($0 \leq x \leq 1$)). In other embodiments, working substrate 220 is an oxide. Representative oxides include tantalates, niobates, and titanates. In other embodiments, working substrate 220 comprises glass, glass ceramic, or ceramic, including, for example, sapphire, boron carbide, or silicon carbide. In yet other embodiments, working substrate 220 may comprise one or more semiconductor materials including, for example, silicon, germanium, gallium arsenide, indium antimonide, indium arsenide, gallium nitride, and/or indium phosphide. It is also contemplated that working substrate 220 is formed of one or more of the materials disclosed above with reference to carrier substrate 210. Working substrate 220 may be comprised of a single layer of material or a plurality of layers (e.g. a laminate) of the same or different materials.

Working substrate 220 may have an initial average thickness (at step 110) in a range from 10 microns to 1,000 microns, or from 50 microns to 800 microns, or from 100 microns to 400 microns or greater than 10 microns, or greater than 50 microns, or greater than 100 microns, or greater than 200 microns, or greater than 300 microns, or greater than 400 microns, or greater than 600 microns, or greater than 700 microns.

In processes in which working substrate 220 is thinned at step 120, working substrate 220 may have an average thickness after thinning of 10.0 microns or less, or 5.0 microns or less, or 3.0 microns or less, or 2.0 microns or less, or 1.0 micron or less, or 0.7 micron or less, or 0.5 micron or less, or in a range from 0.2 microns to 2.0 microns, or 0.4 microns to 1.8 microns, or 0.5 microns to 1.7 microns, or 0.6 microns to 1.5 microns, or 0.8 microns to 1.2 microns.

The total thickness variation (TTV) of working substrate 220 after processing (e.g. after thinning) at step 120 is less than 3.0 microns, or less than 2.5 microns, or less than 2.0 microns, or less than 1.7 microns, or less than 1.5 microns, or less than 1.2 microns, or less than 1.0 microns, or less than 0.7 microns, or less than 0.5 microns, or less than 0.3 microns, or less than 0.2 microns, or less than 0.1 microns, or less than 0.05 microns, or in a range from 0.05 microns to 2.0 microns, or in a range from 0.1 microns to 1.5 microns, or in a range from 0.1 microns to 1.0 microns, or in a range from 0.1 microns to 0.8 microns, or in a range from 0.1 microns to 0.5 microns.

In embodiments, first surface 222 of working substrate 220 has a low surface roughness $R_a$. Without wishing to be bound by theory, it is thought that a low roughness of first surface 222 allows for a reduction in the average thickness of bonding structure 205, which in turn leads to a reduction in total thickness variation (TTV) of bonding structure 205 (see below). In embodiments, first surface 222 of working substrate 220 has a surface roughness $R_a$ of less than 2.00 nm, or less than 1.50 nm, or less than 1.00 nm, or less than 0.50 nm, or less than 0.25 nm or less, or in a range from 0.10 nm to 2.00 nm, or in a range from 0.30 nm to 1.70 nm, or in a range from 0.50 nm to 1.60 nm, or in a range from 0.70 nm to 1.50 nm, or in a range from 0.90 nm to 1.40 nm.

In some embodiments, the carrier substrate 210 is selected to have a coefficient of thermal expansion (CTE) that matches or closely matches the coefficient of thermal expansion (CTE) of support substrate 230. A large difference in thermal expansion of the carrier substrate 210 and the support substrate 230 could be problematic when the attachment of working substrate 220 to the support substrate 230 requires exposing working substrate 220 to a range of temperatures (e.g. annealing). A mismatch in coefficient of thermal expansion (CTE) may create thermal stresses that fracture bonding structure 205 to cause inadvertent separation of carrier substrate 210 and working substrate 220. Thermal stresses may also lead to cracking or other damage to carrier substrate 210 and/or working substrate 220. Additionally or alternatively, the average thicknesses of carrier substrate 210 and/or working substrate 220 are optimally chosen to reduce thermal stresses associated with CTE mismatch between carrier substrate 210 and working substrate 220 during thermal processing of working substrate 220.

In some embodiments, a difference between the CTE of the material of carrier substrate 210 and the CTE of the material of support substrate 230, at a temperature of 250° C., is from 0 ppm/° C. to 1.0 ppm/° C., or from 0.1 ppm/° C. to 0.9 ppm/° C., or from 0.2 ppm/° C. to 0.8 ppm/° C., or from 0.3 ppm/° C. to 0.7 ppm/° C. In one embodiment, carrier substrate 210 is SG3.4 glass and support substrate 230 is silicon (e.g., a silicon wafer). Measurements indicate that the difference in CTE between SG3.4 and silicon is less than or equal to 0.15 ppm/° C. at each temperature in a range from room temperature to a temperature of 300° C. It was also found in some embodiments that when the CTE difference between the material of carrier substrate 210 and the material of working substrate 220 is relatively high (such as, for example, 10 ppm/° C. or higher), the peak temperature during thermal processing of working substrate 220 should be kept low (such as, for example, 100° C. or lower) to reduce stress and the likelihood of fracture.

The bonding structure 205 is situated between and directly contacts the carrier substrate and the working substrate in the embodiment shown in FIG. 5. Bonding structure 205 includes one or more layers. In one embodiment, bonding structure 205 is a single layer that directly contacts carrier substrate 210 and working substrate 220. In another embodiment, bonding structure 205 includes two layers, one of which directly contacts carrier substrate 210 and the other of which directly contacts working substrate 220, where the two layers directly contact each other. In other embodiments, bonding structure 205 includes three or more layers. Specific examples of suitable layers for bonding structure 205 are described below.

In one embodiment, all layers of bonding structure 205 are formed on carrier substrate 210 and first surface 222 of working substrate 220 is contacted to bonding structure 205 to temporarily bond carrier substrate 210 and working substrate 220 in step 110. In another embodiment, all layers of bonding structure 205 are formed on working substrate 220 and first surface 212 of carrier substrate 210 is contacted to bonding structure 205 to temporarily bond carrier substrate 210 and working substrate 220 in step 110. In embodiments, one or more layers of bonding structure 205 are formed on carrier substrate 210, one or more layers of bonding structure 205 are formed on working substrate 220, and the exposed layers of bonding structure 205 on carrier substrate 210 and working substrate 220 are contacted to bonding structure 205 to temporarily bond carrier substrate 210 and working substrate 220 in step 110.

When contacting carrier substrate 210, bonding structure 205 may contact the entirety of the area of first surface 212 or a portion thereof. When contacting working substrate 220, bonding structure 205 may contact the entirety of the area of first surface 222 or a portion thereof. Bonding structure 205 may extend continuously between carrier substrate 210 and working substrate 220 over the entirety of first surface 212 or first surface 222, or may include multiple discrete and separated portions (e.g. an edge portion separated by a gap from an interior portion).

The average thickness of bonding structure 205 is preferably small. Without wishing to be bound by theory, it is believed that small average thickness for bonding structure 205 leads to low total thickness variation (TTV) for bonding structure 205. Bonding structure 205 may have an average thickness less than 2000 nm, or less than 1500 nm, or less than 1000 nm, or less than 500 nm, or less than 200 nm, or less than 100 nm, or less than 80 nm, or less than 60 nm, or less than 40 nm, or less than 20 nm, or less than 10.0 nm, or less than 5.0 nm, or less than 3.0 nm, or less than 2.0 nm, or less than 1.0 nm, or less than 0.5 nm. Additionally or alternatively, the average thickness of bonding structure 205 is greater than 0.1 nm, or greater than 0.2 nm, or greater than 0.3 nm, or greater than 0.5 nm. In some embodiments, the average thickness of bonding structure 205 is or in a range from 1.0 nm to 2000 nm, or in a range from 3.0 nm to 1500 nm, or in a range from 5.0 nm to 1000 nm, or in a range from 10.0 nm to 500 nm, or in a range from 1.0 nm to 100 nm, or in a range from 3.0 nm to 90 nm, or in a range from 5.0 nm to 80 nm, or in a range from 10 nm to 70 nm, or in a range from 15 nm to 60 nm.

In the thickness regime of bonding structure 205 described herein, direct measurement of total thickness variation (TTV) is conducted by scanning electron microscope. The difference of maximal thickness and minimum thickness is considered as TTV, which typically corresponds approximately to 10% of the average thickness of bonding structure 205. Bonding structure 205 may have a total thickness variation (TTV) less than 200 nm, or less than 150 nm, or less than 100 nm, or less than 50 nm, or less than 20 nm, or less than 10.0 nm, or less than 8.0 nm, or less than 6.0 nm, or less than 4.0 nm, or less than 2.0 nm, or less than 1.0 nm, or less than 0.5 nm, or less than 0.3 nm, or less than 0.2 nm, or less than 0.1 nm, or in a range from 0.1 nm to 200 nm, or in a range from 0.3 nm to 150 nm, or in a range from 0.5 nm to 100 nm, or in a range from 1.0 nm to 50 nm, or in a range from 0.1 nm to 10.0 nm, or in a range from 0.2 nm to 9.0 nm, or in a range from 0.5 nm to 8.0 nm, or in a range from 1.0 nm to 7.0 nm, or in a range from 1.5 nm to 6.0 nm.

Support unit 215 consists of carrier substrate 210 and bonding structure 205. The total thickness variation (TTV) of support unit 215 is consistent with the total thickness variations of carrier substrate 210 and bonding structure 205. In particular, since the average thickness of bonding structure 205 is significantly less than the average thickness of carrier substrate 210, the total thickness variation (TTV) of support unit 215 will closely approximate the total thickness variation (TTV) of carrier substrate 210. The total thickness variation (TTV) of support unit 215 is less than 3.0 microns, or less than 2.5 microns, or less than 2.0 microns, or less than 1.7 microns, or less than 1.5 microns, or less than 1.2 microns, or less than 1.0 microns, or less than 0.7 microns, or less than 0.5 microns, or less than 0.3 microns, or less than 0.2 microns, or less than 0.1 microns, or less than 0.05 microns, or in a range from 0.05 microns to 2.0 microns, or in a range from 0.1 microns to 1.5 microns, or in a range from 0.1 microns to 1.0 microns, or in a range from 0.1 microns to 0.8 microns, or in a range from 0.1 microns to 0.5 microns.

Article 200 includes carrier substrate 210, bonding structure 205, and working substrate 220. The total thickness variation (TTV) of article 200 is consistent with the total thickness variations of carrier substrate 210, bonding structure 205, and working substrate 220. Since the average thickness of bonding structure 205 is significantly less than the average thickness of carrier substrate 210 and working substrate 220, the total thickness variation (TTV) of article 200 will closely approximate the total thickness variation (TTV) of carrier substrate 210 and working substrate 220. The total thickness variation (TTV) of article 200 is less than 3.0 microns, or less than 2.5 microns, or less than 2.0 microns, or less than 1.7 microns, or less than 1.5 microns, or less than 1.2 microns, or less than 1.0 microns, or less than 0.7 microns, or less than 0.5 microns, or less than 0.3 microns, or less than 0.2 microns, or less than 0.1 microns, or less than 0.05 microns, or in a range from 0.05 microns to 2.0 microns, or in a range from 0.1 microns to 1.5 microns, or in a range from 0.1 microns to 1.0 microns, or in a range from 0.1 microns to 0.8 microns, or in a range from 0.1 microns to 0.5 microns.

The attachment provided by bonding structure 205 is sufficiently strong to secure working substrate 220 to carrier substrate 210 while working substrate 220 is processed at step 120. Bonding structure 205 maintains the position of working substrate 220 and prevents delamination of working substrate 220 from carrier substrate 210 when working substrate 220 is subjected to force during processing (e.g. shear forces applied during thickness reduction of working substrate 220).

After bonding structure 205 is formed on carrier substrate 210 and/or working substrate 220, working substrate 220 is bonded to carrier substrate 210 in step 110. First surface 212 of carrier substrate 210 (or a layer of bonding structure 205 disposed on first surface 212) and first surface 222 of working substrate 220 (or a layer of bonding structure 205 disposed on first surface 222) are contacted and a pressing force is applied at the center of contact area and wave propagates automatically from the center to the edge of the substrates to bond working substrate 220 to carrier substrate 210. Bonding of carrier substrate 210 and working substrate 220 may include heating bonding structure 205 after contacting. The force and temperature needed to bond carrier substrate 210 and working substrate 220 vary with the composition of the layer(s) of bonding structure 205. Typical conditions include pressing forces of 0 N to 100 N, or 100 N to 1000 N, or 1000 N to 25000 N, or 2000 N to 20000 N, or 3000 N to 15000 N; temperatures of 25° C. to 100° C., or 150° C. to 400° C., or 175° C. to 350° C., or 200° C. to 325° C.; and pressing times of 1 sec (second) to 10 sec, or 10 sec to 1 min (minute), or 1 min to 30 min, or 2 min to 25 min, or 4 min to 20 min, or 5 min to 15 min.

Figure 7:
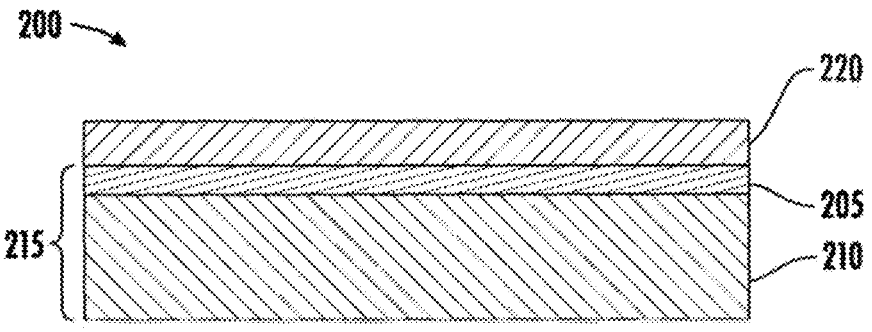
FIG. 7 depicts a cross-sectional view of an article that includes a carrier substrate, a bonding structure, and a processed working substrate.

After working substrate 220 is bonded to carrier substrate 210, working substrate 220 is processed in step 120 as described above. In a preferred embodiment, working substrate 220 is thinned in step 120. FIG. 7 shows article 200 of FIG. 5 after thinning. Thinning occurs by removing material from second surface 224 of working substrate 220 in step 120. As thinning occurs, second surface 224 recedes and the thickness of working substrate 220 is reduced.

Figure 8:
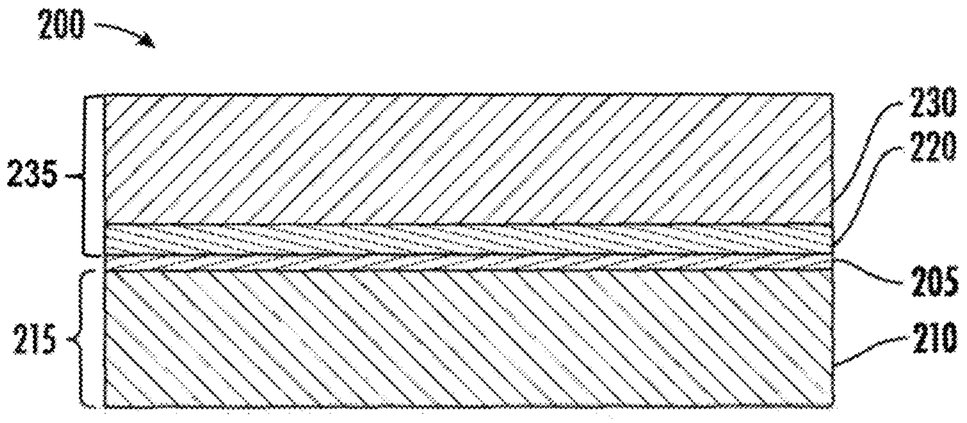
FIG. 8 depicts a cross-sectional view of an article that includes a carrier substrate, a bonding structure, a working substrate, and a support substrate.

Following thinning, at step 130, a support substrate 230 is bonded to second surface 224 of working substrate (FIG. 8). The bond between support substrate 230 and working substrate 220 is preferably a permanent bond and can be formed by fusion bonding, exemplary bonding mechanism is covalent bonding. can be formed with bonding materials known in the art. Exemplary bonding materials include BrewerBOND® 305 (available from Brewer Sciences, Inc. (Rolla, MO)) and bonding materials such as those described in U.S. Pat. No. 9,827,740 and U.S. Pat. Appl. Pub. Nos. 2021/0261836 and 2022/0140227.

Support substrate 230 may be configured to support electrodes, electrical circuits, waveguides, or other optical, optoelectronic, electronic, power devices. Exemplary materials of support substrate 230 include, for example, glass, glass ceramic, or ceramic, including, for example, sapphire, silicon carbide, and/or semiconductor materials such as silicon, germanium, gallium arsenide, indium antimonite, indium arsenide, gallium nitride, and/or indium phosphide. It is also contemplated that support substrate 230 is formed of one or more of the materials disclosed with reference to carrier substrate 210, as discussed above. In some embodiments, support substrate 230 is a semiconductor wafer comprised of silicon. Support substrate 230 is a single layer or a plurality of layers.

Support substrate 230 may have any thickness. In preferred embodiments, the thickness of support substrate 230 is greater than 100 microns, or greater than 200 microns, or greater than 400 microns, or greater than 600 microns or greater than 800 microns or greater than 1.0 mm, or in a range from 100 microns to 2.0 mm, or in a range from 200 microns to 1.0 mm, or in a range from 300 microns to 900 microns, or in a range from 400 microns to 800 microns.

Working substrate 220 and support substrate 230 form a device unit 235. Device unit 235 constitutes an article in which working substrate 220 and support substrate 230 cooperate to provide electrical, optical, optoelectronic, or signal filter functionality.

Processed working substrate 220 is separated from carrier substrate 210 in step 140 to release device unit 235. As described below, separation of working substrate 220 from carrier substrate 210 is accomplished in a debonding process in which the temporary bonding of bonding structure 205 is reversed or weaken to facilitate or enable release of processed working substrate 220 from carrier substrate 210. Preferably and as described below, the debonding process includes application of light to a photochemically or photothermally active layer of bonding structure 205 to reverse or weaken the temporary bonding between carrier substrate 210 and working substrate 220. Residue from bonding structure 205, if present on first surface 212 of carrier substrate 210 or first surface 222 of working substrate 220 after debonding, is removed by cleaning. Cleaning processes include treatment with a solvent, sonic cleaning, air jet, wiping, brushing etc. After debonding, carrier substrate 210 remains in good condition and may be reused in the processing of other working substrates.

In some embodiments, the functionality of device unit 235 is influenced by the total thickness variation (TTV) of the working substrate 220 and the total thickness variation (TTV) of support substrate 230 has only a limited effect on the functionality of device unit 235. In such embodiments, the total thickness variation (TTV) of working substrate 220 is less than the total thickness variation (TTV) of support substrate 230. As a result, common substrates can be used as support substrate 230 and no special treatments to reduce the total thickness variation (TTV) of support substrate 230 are needed. The low total thickness variation (TTV) of working substrate 220, as discussed in connection with steps 110 and 120 above, dictates and controls the performance of device unit 235.

An example in which the total thickness variation (TTV) of support substrate 230 can be greater than the total thickness variation (TTV) of working substrate 220 is a device unit 235 that includes $LiTaO_3$ (or other piezoelectric material) as working substrate 220 and a silicon wafer (optionally with surface layers) as support substrate 230. Such a device unit 235 can be used as a SAW (surface acoustic wave) or BAW (bulk acoustic wave) filter for high bandwidth communications.

The total thickness variation (TTV) of working substrate 220 in device unit 235 is the total thickness variation (TTV) of working substrate 220 after processing in step 120 and is as described above. In embodiments, the total thickness variation (TTV) of support substrate 230 in device unit 235 is greater than 0.5 microns, or greater than 1.0 microns, or greater than 2.0 microns, or greater than 3.0 microns, or greater than 4.0 microns, or greater than 5.0 microns, or greater than 6.0 microns, or greater than 8.0 microns, or in a range from 0.5 microns to 10.0 microns, or in a range from 1.0 microns to 8.0 microns, or in a range from 2.0 microns to 7.0 microns, or in a range from 3.0 microns to 6.0 microns. In other embodiments, the total thickness variation (TTV) of support substrate 230 in device unit 235 is at least 10%, or at least 25%, or at least 50%, or at least 100%, or at least 200%, or at least 400%, or at least 600%, or at least 800%, or in the range from 10% to 1000%, or in the range from 25% to 800%, or in the range from 50% to 600%, or in the range from 100% to 400% of the total thickness variation (TTV) of working substrate 220 in device unit 235. By way of example, if the total thickness variation (TTV) of working substrate 220 is 2.0 microns and the total thickness variation (TTV) of support substrate 230 is 4.0 microns, the total thickness variation (TTV) of support substrate 230 is 200% of the total thickness variation (TTV) of working substrate.

Composition, Bonding Energy and Release of Bonding Structure

The bonding of working substrate 220 to carrier substrate 210 provided by bonding structure 205 is temporary and can be reversed by applying energy to bonding structure 205 in step 140. Reversal of temporary bonding enables separation of working substrate 220 from carrier substrate 210. Reversal of temporary bonding corresponds to a "debonding" process in which the attachment between working substrate 220 and carrier substrate 210 is severed. Debonding is also referred to herein as "release" to signify physical separation of working substate 220 and carrier substrate 210.

To facilitate release, bonding structure 205 includes at least one release layer. A release layer is a layer that, when subjected to energy, is disrupted, ablated, damaged, destroyed or decomposed to weaken or remove the bonding between working substrate 220 and carrier substrate 210 to a degree sufficient to enable physical separation of working substrate 220 and carrier substrate 210 in step 140. In one embodiment, bonding structure 205 consists essentially of a release layer. In another embodiment, bonding structure 205 includes two or more release layers. In a further embodiment, bonding structure 205 includes a release layer and an adhesive in contact with the release layer. The adhesive includes one or more adhesion layers. The release layer may be in direct contact with carrier substrate 210 and the adhesive may be in direct contact with working substrate 220, or the release layer may be in direct contact with working substrate 220 and the adhesive may be in direct contact with carrier substrate 210.

Photo-release Layer. In a preferred embodiment, the energy applied to the release layer of bonding structure 205 to separate working substrate 220 and carrier substrate 210 is provided by light. Sources of light include lasers, diodes, and lamps. A release layer amendable to debonding with light is referred to herein as a "photo-release layer". A photo-release layer absorbs energy from the light. The absorbed energy transforms the photo-release layer through a chemical (e.g. photoreaction), physical (e.g. ablation), or thermal (e.g. photothermal) process to a debonded state that causes separation of working substrate 220 and carrier substrate 210. The absorption is preferably linear absorption and the energy of light needed to debond the photo-release is preferably low to prevent incidental damage to carrier substrate 210 or working substrate 220 by the light during the debonding process.

The light used to debond the photo-release layer may be provided by a pulsed or continuous light source. To minimize the energy of light required for debonding, the photo-release layer preferably has a high extinction coefficient at the wavelength of the light used for debonding. The extinction coefficient of the photo-release layer at the wavelength of the light is greater than 0.005, or greater than 0.010, or greater than 0.030, or greater than 0.050, or greater than 0.100, or greater than 0.150, or greater than 0.200, or greater than 0.250, or greater than 0.300, or greater than 0.500, or greater than 1.000, or in the range from 0.010 to 1.000, or in the range from 0.020 to 0.500, or in the range from 0.030 to 0.400, or in the range from 0.050 to 0.300. Debonding of the photo-release layer with light can be accomplished with various wavelengths of the light, including but not limited to 1064 nm, 647 nm, 632 nm, 532 nm, 488 nm, 442 nm, 355 nm, 325 nm, 308 nm, 266 nm, 248 nm, 193 nm, as well as wavelengths in the range from 190 nm to 1100 nm, or 190 nm to 700 nm, or 190 nm to 500 nm, or 190 nm to 450 nm, or 190 nm to 400 nm, or 200 nm to 1200 nm, or 250 nm to 1000 nm, or, 300 nm to 800 nm, or 350 nm to 600 nm, or 200 nm to 700 nm, or 200 nm to 600 nm, or 200 nm to 500 nm, or 220 nm to 475 nm, or 240 nm to 450 nm, or 260 nm to 425 nm, or 280 nm to 400 nm, or 300 nm to 375 nm. The photo-release layer is selected to have an extinction coefficient in any of the ranges noted above at any of the wavelengths or wavelength ranges noted above. As used herein, reference to a photo-release layer having a particular extinction coefficient "at a wavelength in a range from X to Y" means that the photo-release layer has the particular extinction coefficient at at least one wavelength in the specified range X to Y. Representative light sources for debonding the photo-release layer include Nd:YAG, HeNe, Ar, Kr, HeCd, excimer lasers (e.g. ArF, KrF), dye lasers, diode lasers, diodes, or lamps (e.g. Xe, tungsten halide).

Representative materials for the photo-release layer include polymers. Preferred polymers are polyimides and polyamic acid with a weight average molecular weight in the range from 1000 g/mol to 100,000 g/mol, or in the range from 2000 g/mol to 80,000 g/mol, or in the range from 3000 g/mol to 60,000 g/mol, or in the range from 4000 g/mol to 40,000 g/mol, or in the range from 5000 g/mol to 20,000 g/mol. Polyimides and polyamic acid include photosensitive functional groups that enable release with light through a photochemical or photothermal reaction or transformation. Other photo-release layers include melamine compounds and polymers derived from melamine compounds. Commercial examples of photo-release layers include BrewerBOND® 701 (available from Brewer Sciences, Inc. (Rolla, MO)) and SPIS-TA-401S (available from Shin-Etsu Chemical Co., Ltd (Tokyo, JP)). Other examples of materials for photo-release layers are disclosed in U.S. Pat. No. 9,827,740.

The photo-release layer of bonding structure 205 is applied to working substrate 220 and/or carrier substrate 210 in step 110. In a preferred embodiment, the photo-release layer is formed by applying a liquid precursor of the photo-release layer to first surface 222 of working substrate 220, first surface 212 of carrier substrate 210, and/or a surface of an adhesion layer disposed on first surface 222 of working substrate 220 or first surface 212 of carrier substrate 210. In one embodiment, the liquid precursor includes a polymer dissolved or dispersed in a solvent. The liquid precursor can be applied, for example, by spin coating or other methods known in the art to promote uniform thickness of the photo-release layer. Spin coating, for example, can occur at speeds of 500 rpm (revolutions per minute) to 10000 rpm, or 1000 rpm to 7000 rpm, or 2000 rpm to 6000 rpm for a time period of 10 seconds to 300 seconds, or 20 seconds to 200 seconds, or 30 seconds to 150 seconds. Once applied, the liquid precursor may optionally be heated (e.g. to evaporate solvents, cure, or crosslink the liquid precursor). Heating of polyamic acid leads to formation of imide groups. Typical heating temperatures are 200° C. to 400° C., or 250° C. to 350° C. for a time period of 1 minute to 30 minutes, or 2 minutes to 15 minutes, or 3 minutes to 10 minutes, or 10 minutes to 60 minutes, or 60 minutes to 720 minutes.

The photo-release layer has an average thickness less than 2000 nm, or less than 1500 nm, or less than 1000 nm, or less than 500 nm, or less than 200 nm, or less than 100 nm, or less than 80 nm, or less than 60 nm, or less than 40 nm, or less than 20 nm, or less than 10.0 nm, or less than 5.0 nm, or less than 3.0 nm, or less than 2.0 nm, or less than 1.0 nm, or less than 0.5 nm. Additionally or alternatively, the average thickness of the photo-release layer is greater than 0.1 nm, or greater than 0.2 nm, or greater than 0.3 nm, or greater than 0.5 nm. In some embodiments, the average thickness of the photo-release layer is in a range from 1.0 nm to 2000 nm, or in a range from 3.0 nm to 1500 nm, or in a range from 5.0 nm to 1000 nm, or in a range from 10.0 nm to 500 nm, or in a range from 1.0 nm to 100 nm, or in a range from 3.0 nm to 90 nm, or in a range from 5.0 nm to 80 nm, or in a range from 10 nm to 70 nm, or in a range from 15 nm to 60 nm.

The photo-release layer has a total thickness variation (TTV) less than 200 nm, or less than 150 nm, or less than 100 nm, or less than 50 nm, or less than 20 nm, or less than 10.0 nm, or less than 8.0 nm, or less than 6.0 nm, or less than 4.0 nm, or less than 2.0 nm, or less than 1.0 nm, or less than 0.5 nm, or less than 0.3 nm, or less than 0.2 nm, or less than 0.1 nm, or in a range from 0.1 nm to 200 nm, or in a range from 0.3 nm to 150 nm, or in a range from 0.5 nm to 100 nm, or in a range from 1.0 nm to 50 nm, or in a range from 0.1 nm to 10.0 nm, or in a range from 0.2 nm to 9.0 nm, or in a range from 0.5 nm to 8.0 nm, or in a range from 1.0 nm to 7.0 nm, or in a range from 1.5 nm to 6.0 nm.

After application and curing of the liquid precursor to form the photo-release layer, the photo-release layer is treated with a plasma. The plasma treatment includes exposing a surface of the photo-release layer to a plasma. While not wishing to be bound by theory, plasma treatment is believed to activate the surface of the photo-release layer to render it more reactive and/or more hydrophilic. The increased reactivity and/or hydrophilicity are expected to increase the strength of attachment of working substrate 220 to carrier substrate 210 provided by the photo-release layer when carrier substrate 210 and working substrate 220 are joined in a succeeding step.

Figure 6:
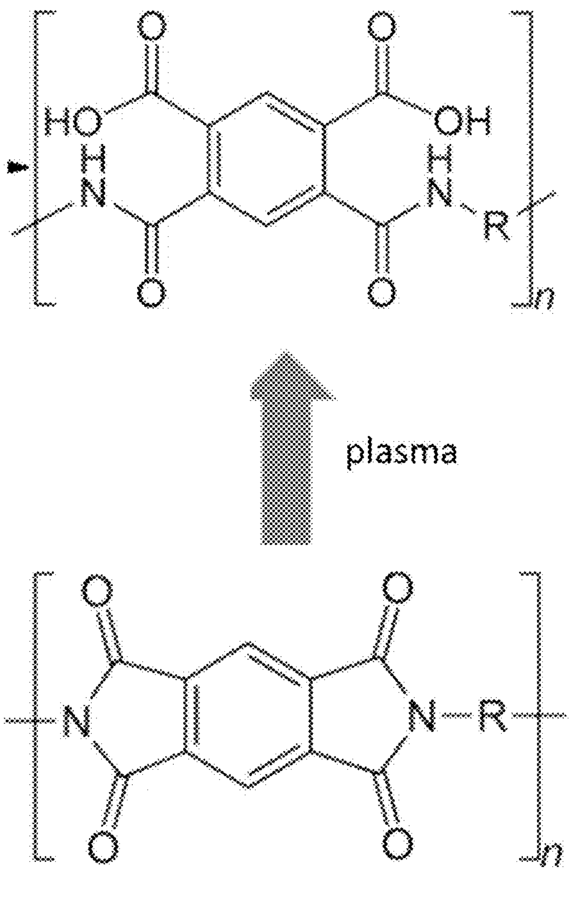
FIG. 6 depicts surface activation of a polyimide with a plasma.

FIG. 6 illustrates a proposed plasma activation mechanism for imide groups in a polyimide photo-release layer. Treatment of the polyimide with a plasma is believed to open the imide ring to produce amine (—NH—) and carboxyl (—COOH) groups that are capable of reacting or hydrogen bonding with receiving surfaces. As an example, a photo-release layer including a polyimide may be formed on first surface 212 of carrier substrate 210 (or on the surface of an adhesion layer disposed on first surface 212) and treated with a plasma to activate its surface. The activated surface of the photo-release layer may then be contacted with first surface 222 of working substrate 220 (or the surface of an adhesion layer disposed on first surface 222). The activated sites of the photo-release layer may react with elements or functional groups present at or on first surface 222 (or the surface of an adhesion layer disposed on first surface 222) to increase the bonding energy of the photo-release layer to working substrate 220. Active amine or carboxyl groups, for example, may react, interact, or associate with oxide, hydroxyl, or water groups present at or on first surface 222 (or the surface of an adhesion layer disposed on first surface 222) of working substrate 220. Plasma activation may also form reactive unsaturated bonds or radical sites on the surface of the photo-release layer.

As another example, a photo-release layer including a polyimide may be formed on first surface 222 of working substrate 220 and treated with a plasma to activate its surface. The activated surface of the photo-release layer may then be contacted with first surface 212 of carrier substrate 210 (or the surface of an adhesion layer disposed on first surface 212). The activated sites of the photo-release layer may react with elements or functional groups present at or on first surface 212 (or the surface of an adhesion layer disposed on first surface 212) to increase the bonding energy of photo-release layer to carrier substrate 210. Active amine or carboxyl groups, for example, may react, interact, or associate with oxide, hydroxyl, or water groups present at or on first surface 212 (or the surface of an adhesion layer disposed on first surface 212) of carrier substrate 210.

Suitable plasmas capable of activating the surface of the photo-release layer include $O_2$, $N_2$, Ar, or combinations thereof. Typical conditions of plasma activation are plasma power of 50 W to 500 W, or 100 W to 400 W, or 150 W to 300 W for times of 1 sec to 200 sec, or 5 sec to 150 sec, or 10 sec to 100 sec, or 20 sec to 50 sec at plasma gas flow rates of 5 sccm (standard cubic centimeters per minute) to 100 sccm, or 10 sccm to 80 sccm, or 20 sccm to 70 sccm, or 30 sccm to 60 sccm. Control of the plasma treatment conditions provides control over the degree of surface activation. Variations in the plasma power or time of exposure of the photo-release layer to the plasma, for example, can be used to control the fraction of imide groups of a polyimide that become activated.

The strength of attachment of working substrate 220 to carrier substrate 210 by bonding structure 205 is referred to herein as "bonding energy", which is a measurement of the energy required to separate working substrate 220 from carrier substrate 210. For purposes of the present disclosure, bonding energy is determined using the wedge test method discussed in Tong, Q. Y., et al. "Semiconductor Wafer Bonding", Annual Reviews of Materials Science, vol. 28, no. 1. pp. 215-241, 1998, which is incorporated herein by reference. To summarize the method, the bonding energy is determined by inserting a blade between carrier substrate 210 and working substrate 220 and measuring the crack length. The blade has a thickness of 97 microns to 107 microns and is inserted into the bonding structure 205 to a depth of 10 mm. The bonding energy W is related to the Young's modulus $E_1$ of carrier substrate 210, the thickness $t_{w1}$ of carrier substrate 210, the Young's modulus $E_2$ of working substrate 220, the thickness $t_{w2}$ of working substrate 220, a thickness $t_b$ of the blade, and a crack length L, as shown in equation (1):

$$W = \frac{3}{8}\frac{t_b^2 E_1 t_{w1}^3 E_2 t_{w2}^3}{L^4\left(E_1 t_{w1}^3 + E_2 t_{w2}^3\right)} \quad (1)$$

In some embodiments, bonding structure 205 bonds working substrate 220 to carrier substrate 210 with a bonding energy of greater than 200 mJ/m$^2$, or greater than 300 mJ/m$^2$, or greater than 400 mJ/m$^2$, or greater than 600 mJ/m$^2$, or greater than 1000 mJ/m$^2$, or greater than 1500 mJ/m$^2$, or greater than 2000 mJ/m$^2$, or greater than 2500 mJ/m$^2$, or greater than 3000 mJ/m$^2$, or greater than 3500 mJ/m$^2$, or greater than 4000 mJ/m$^2$, or greater than 4500 mJ/m$^2$, or greater than 5000 mJ/m$^2$, or greater than 5500 mJ/m$^2$, or in the range from 200 mJ/m$^2$ to 7000 mJ/m$^2$, or in the range from 400 mJ/m$^2$ to 6500 mJ/m$^2$, or in the range from 600 mJ/m$^2$ to 6000 mJ/m$^2$, or in the range from 800 mJ/m$^2$ to 5000 mJ/m$^2$, or in the range from 1000 mJ/m$^2$ to 4000 mJ/m$^2$, or in the range from 1500 mJ/m$^2$ to 3500 mJ/m$^2$. In some embodiments, bonding energy is increased by increasing the curing time of liquid precursor or by thermal annealing bonding structure 205 after bonding working substrate 220 to carrier substrate 210. For example, bonding structure 205 before bonding may be thermally annealed or cured at a temperature in a range of 200° C. to 500° C. for 5 min to 12 hours. For example, bonding structure 205 may be thermally annealed at a temperature in a range of 50° C. to 500° C. for 5 minutes to 20 hours.

After plasma treatment, carrier substrate 210 and working substrate 220 are bonded in step 110. A plasma-activated photo-release layer is disposed on at least one of first surface 212 (or the surface of an adhesion layer disposed on first surface 212) of carrier substrate 210 or first surface 222 (or the surface of an adhesion layer disposed on first surface 222) of working substrate 220. The surfaces to be bonded are contacted and a pressing force with optional heating is applied to bond working substrate 220 to carrier substrate 210 as described above.

The activation of the photo-release layer with the plasma may be transitory. That is, the plasma-activated surface of the photo-release layer may constitute a metastable state that relaxes back to the original state over time. Relaxation of the plasma-activated metastable state of the surface may lead to a reduction in the bonding energy provided by bonding structure 205. Accordingly, it is preferable to bond carrier substrate 210 and working substrate 220 soon after plasma treatment of the photo-release layer. In embodiments, bonding of carrier substrate 210 to working substrate 220 occurs less than 8 hours, or less than 6 hours, or less than 4 hours, or less than 2 hours, or less than 1 hour, or less than 30 minutes, or in a range from 10 minutes to 8 hours, or in a range from 20 minutes to 6 hours, or in a range from 30 minutes to 4 hours, or in a range from 40 minutes to 2 hours after plasma treatment of the surface of the photo-release layer.

Adhesive with Adhesion Layers. In embodiments, bonding structure 205 includes an adhesive in contact with a photo-release layer. The adhesive includes one or more adhesion layers and is preferably in direct contact with the photo-release layer. An adhesion layer of the adhesive may interact with reactive functional groups (e.g. —OH, oxide) groups on first surface 212 of carrier substrate 210 or first surface 222 of working substrate 220 to adhere to carrier substrate 210 or working substrate 220. An adhesion layer of the adhesive may also interact with active sites on the surface of a plasma-activated photo-release layer to adhere to the plasma-activated release layer during bonding of working substrate 220 to carrier substrate 210. Examples of adhesion layers include those described in U.S. Pat. Publ. No. 2021/0261836A, the disclosure of which is incorporated by reference herein.

Preferred adhesives include ionic adhesive layers. More preferred adhesives include ionic adhesive layers of opposite charge. Ionic adhesive layers include cationic adhesive layers and anionic adhesive layers. The ionic adhesive layers are hydrophilic due to interactions between the ionic charges present in the adhesive layers and the dipoles of the water molecules. Substrate surfaces coated with ionic adhesive layers become (or remain) hydrophilic and as a result, may have a high surface energy. While not wishing to be bound by theory, a high surface energy may facilitate temporary bonding of working substrate 220 to carrier substrate 210 in step 110 and may, for example, reduce the force, temperature, and/or time required to form a temporary bond relative to comparable non-ionic adhesive layers.

In some embodiments, the adhesive includes an adhesion layer comprising a cationic polymer. Cationic polymers include a cationic repeat unit. Cationic polymers include homopolymers (single cationic repeat unit) and copolymers (plurality of cationic repeat units or combination of a cationic repeat unit and a non-cationic repeat unit). The cationic polymer is preferably suitable for application by a liquid- or solution-based surface treatment/coating process. In particular, cationic polymers that are water soluble and/or hydrophilic are particularly preferred as are cationic polymers that are thermally and mechanically stable under the processing conditions of step 120. Cationic polymers having a polyalkyl backbone are particularly preferred. Also preferred are cationic polymers comprising aromatic groups, which have higher thermal stability generally. Cationic repeat units can comprise one or more of a positively charged nitrogen, phosphorous, sulfur, boron, or carbon. Representative cationic repeat units include primary, secondary, tertiary, or quaternary ammonium cations, imidazolium cations, pyridinium cations, pyrimidinium cations, pyrrolidinium cations, imidazolium cations, iminium cations, phosphonium cations, sulfonium cations, or combinations thereof. Particularly preferred are cationic repeat units comprising positively charged nitrogen, especially ammonium, pyridinium, and imidazolium cations. In some embodiments, the repeat unit of the cationic polymer comprises a ratio of carbon:nitrogen of from 2:1 to 20:1, or from 3:1 to 15:1, or from 3:1 to 12:1. In some embodiments, the cationic polymer is free, or substantially free, of oxygen.

In one embodiment, the cationic polymer includes a repeat unit with an ammonium cation. The ammonium cation can be a primary, secondary, tertiary, or quaternary ammonium cation. In the cases of a secondary, tertiary, or quaternary ammonium cation, the nitrogen can be substituted with a wide variety of substituents, including but not limited to alkyl, vinyl, allyl, amino, and glycidyl. Each substituent can be further substituted, unsubstituted, protected, or unprotected. Where an alkyl substituent is selected, the substituent may be branched or unbranched, or saturated or unsaturated. Examples of alkyl groups include methyl, ethyl, n-propyl, iso-propyl, n-butyl, iso-butyl, tert-butyl, n-hexyl, n-decyl, tetradecyl, and the like. Methyl and ethyl substitution is particularly preferred.

In one embodiment, the cationic polymer is poly(diallyldimethylammonium chloride) (PDADMAC) (I), or other comparable salt or derivative thereof. In another example, the cationic polymer is poly(vinylbenzyl trimethyl ammonium chloride) (PVBTACl) (II), or other comparable salt or derivative thereof. It is believed that the ring structures of PDADMAC and PVBTACl help to impart thermal stability.

(I)

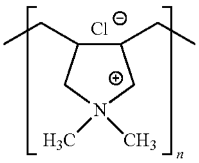

(II)

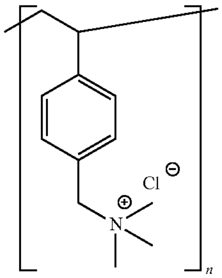

In another embodiment, the cationic polymer includes a repeat unit with a pyridinium or a pyrrolidinium cation. The aromatic ring of the pyridine or pyrrole group can further include any suitable number of substituents covalently bonded to one or more of the ring carbons and/or the nitrogen, and can be independently selected from H, alkyl, vinyl, allyl, amino, glycidyl, and thiol. Each substituent can be further substituted, unsubstituted, protected, or unprotected. Where an alkyl substituent is selected, the substituent may be branched or unbranched, or saturated or unsaturated. Examples of alkyl groups include methyl, ethyl, n-propyl, iso-propyl, n-butyl, iso-butyl, tert-butyl, n-hexyl, n-decyl, tetradecyl, and the like. Preferred examples of cationic polymers containing pyridinium cations include poly(4-vinyl-1-methylpyridinium bromide) (PVMPyBr) (III) and poly(4-vinylpyridine hydrochloride) (PVPyCl) (IV), each of which includes a quaternary nitrogen in an aromatic ring, which is believed to increase thermal stability.

(III)

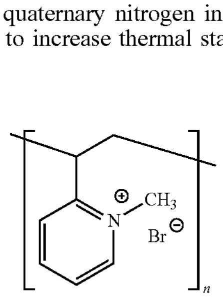

(IV)

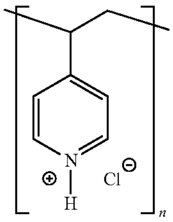

In yet another embodiment, the cationic polymer includes a repeat unit with an imidazolium cation. As described above, an imidazole can be substituted or unsubstituted with a wide variety of suitable substituents covalently bonded to the ring structure. A preferred example of a cationic polymer comprising a repeat unit with an imidazolium cation is LUVIQUAT FC 550 (BASF) (V), a quaternary copolymer of 1-vinylpyrrolidone and 3-methyl-1-vinylimidazolium chloride. LUVIQUAT was selected for the present application due to the combination of the imidazolium ring and the vinylpyrrolidone.

(V)

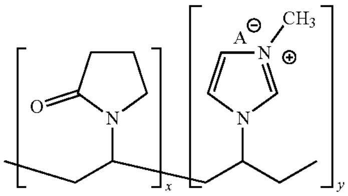

In some embodiments, the adhesive includes an adhesion layer comprising an anionic polymer. Anionic polymers include an anionic repeat unit. Anionic polymers include homopolymers (single anionic repeat unit) and copolymers (plurality of anionic repeat units or combination of an anionic repeat unit and a non-anionic repeat unit). Similar to the cationic polymers discussed above, the anionic polymers according to the present disclosure include any polyanion-based polymer that is thermally and mechanically stable under the processing conditions of step 120. The anionic polymer is preferably suitable for application by a liquid- or solution-based surface treatment and/or coating process. Specifically, water-soluble and/or hydrophilic anionic polymers are preferred. In some embodiments, the anionic repeat unit of the anionic polymer contains a negatively charged oxygen, sulfur, nitrogen, or phosphorus. In some embodiments, the anionic repeat unit of the anionic polymer contains a negatively charged oxygen. Representative anionic repeat units include acrylate anions, sulfate anions, sulfonate anions, or combinations thereof are also preferred. Particularly preferred are sulfonate anions. A preferred example of an anionic polymer including a repeat unit with a sulfonate anion is poly(sodium-4-styrene sulfonate)("PSS")(VI).

(VI)

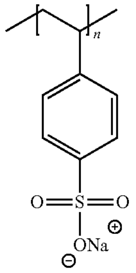

Figure 9:
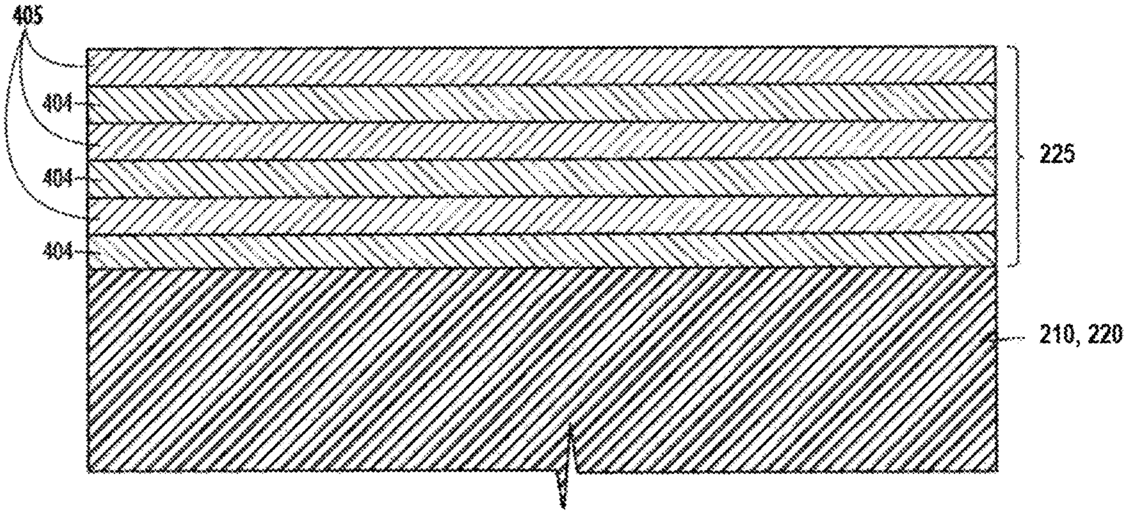
FIG. 9 depicts a cross-sectional view of an article that includes a carrier substrate or a working substrate with an adhesive that includes alternating ionic polymer adhesion layers.

In preferred embodiments, the adhesive includes one or more cationic polymer adhesion layers and one or more anionic polymer adhesion layers. Preferably, the cationic polymer adhesion layers alternate with the anionic polymer adhesion layers. In one exemplary embodiment, as shown in FIG. 9, adhesive 225 is disposed on carrier substrate 210 or working substrate 220. Adhesive 225 comprises alternating layers of cationic polymer adhesion layer 404 and anionic polymer adhesion layer 405. In the embodiment shown in FIG. 9, cationic polymer adhesion layer 404 is in direct contact with carrier substrate 210 or working substrate 220 and adhesive 225 is formed by alternating depositions of anionic polymer adhesion layer 405 and cationic polymer adhesion layer 404. In other embodiments, anionic polymer adhesion layer 405 is in direct contact with carrier substrate 210 or working substrate 220 and adhesive 225 is formed by alternating depositions of cationic polymer adhesion layer 404 and anionic polymer adhesion layer 405. In further embodiments, adhesive 225 is formed directly on one of carrier substrate 210 and working substrate 220, and a photo-release layer is formed directly on the other of carrier substrate 210 and working substrate 220 in step 110.

In some embodiments, cationic polymer adhesion layers 404 are monolayers of a cationic polymer and anionic adhesion layers 405 are monolayers of an anionic polymer. Without wishing to be bound by theory, it is believed that because identically charged polymers repel each other, formation of a thicker adhesive 225 through application of a plurality of monolayers of either a cationic polymer adhesion layer or an anionic polymer adhesion layer in succession may be difficult or lead to structural defects that may inhibit adhesion. By alternating thin layers (e.g., monolayers) of a cationic polymer with thin layers (e.g., monolayers) of an anionic polymer, a thicker, more uniform adhesive 225 can be obtained.

In some embodiments, the total number of alternating cationic polymer adhesion layers 404 and anionic polymer adhesion layers 405 is even. In other embodiments, the total number of alternating cationic polymer adhesion layers 404 and anionic polymer adhesion layers 405 is odd. Bonding structure 205 may include an adhesive 225 that contains a combined total of cationic polymer adhesion layers and anionic polymer adhesion layers in a range from two to twenty five, or three to 20, or 5 to 15. In certain aspects, bonding structure 205 comprises 2 or more, 3 or more, 4 or more, 5 or more, 6 or more, 7 or more, 8 or more, 9 or more or 10 or more ionic polymer adhesion layers.

The ionic (cationic and anionic) polymer adhesion layers are preferably formed through application of a liquid precursor of the ionic polymer (e.g., solution or suspension of the ionic polymer) to the receiving surface (e.g., first surface 212 of carrier substrate 210 or first surface 222 of working substrate 220). A preferred method of application is spin coating. Spin coating, for example, can occur at speeds of 100 rpm (revolutions per minute) to 5000 rpm, or 200 rpm to 4000 rpm, or 300 rpm to 3000 rpm for a time period of 10 seconds to 300 seconds, or 20 seconds to 200 seconds, or 30 seconds to 150 seconds. Once applied, the liquid precursor may optionally be heated (e.g. to evaporate solvents) or optionally not heated to keep good hydration of ionic polymers. Typical heating temperatures are 50° C. to 300° C., or 75° C. to 200° C. for a time period of 10 sec to 20 min, or 1 min to 20 min, or 2 min to 15 min, or 3 min to 10 min. The spin coating procedure can be repeated multiple times to form a plurality of ionic polymer adhesion layers. Other methods of application of the liquid precursor include rinsing, immersing, dip coating, and spraying. An optional rinse (e.g. with deionized water) may be applied after formation of each layer to remove excess amounts of the liquid precursor (if present).

The adhesive may have an average thickness less than 2000 nm, or less than 1500 nm, or less than 1000 nm, or less than 500 nm, or less than 200 nm, or less than 100 nm, or less than 80 nm, or less than 60 nm, or less than 40 nm, or less than 20 nm, or less than 10.0 nm, or less than 5.0 nm, or less than 3.0 nm, or less than 2.0 nm, or less than 1.0 nm, or less than 0.5 nm. Additionally or alternatively, the average thickness of the adhesive is greater than 0.1 nm, or greater than 0.2 nm, or greater than 0.3 nm, or greater than 0.5 nm. In some embodiments, the average thickness of the adhesive is or in a range from 1.0 nm to 2000 nm, or in a range from 3.0 nm to 1500 nm, or in a range from 5.0 nm to 1000 nm, or in a range from 10.0 nm to 500 nm, or in a range from 1.0 nm to 100 nm, or in a range from 3.0 nm to 90 nm, or in a range from 5.0 nm to 80 nm, or in a range from 10 nm to 70 nm, or in a range from 15 nm to 60 nm.

The adhesion layers of the adhesive are not subject to debonding under the conditions used to debond the photo-release layer. That is, when subjected to the light conditions used to debond the photo-release layer in step 140, the adhesion layers remain intact and do not photochemically react, ablate, or otherwise transform to a state that weakens the bonding energy between working substrate 220 and carrier substrate 210. To avoid transformation by light, the adhesion layers are selected to have a negligible extinction coefficient at the wavelength of the light used to debond the photo-release layer. The extinction coefficient of the adhesion layers, including the cationic polymer adhesion layers and anionic polymer adhesion layers described herein, at the wavelength of the light used to debond the photo-release layer is less than 0.005, or less than 0.001, or less than 0.0005, or less than 0.0001, or less than 0.00005, or less than 0.00001.

Example 1

This example demonstrates an increase in bonding energy that occurs upon plasma treatment of a photo-release layer. The substrate materials selected for this example were SG 3.4 (a silicate glass wafer available from Corning Incorporated) and a $LiTaO_3$ wafer (available from Yamaju Ceramics Co., Ltd). The SG 3.4 substrate had dimensions of 150±0.2 mm in diameter with TTV below 0.2 micron. The $LiTaO_3$ substrate had dimensions of 150±0.2 mm in diameter with TTV below 1.5 micron. Five samples based on the substrates were considered. Samples 1, 2, 3, and 4 used SG 3.4 as both a carrier substrate and a working substrate. Sample 5 used SG 3.4 as a carrier substrate and $LiTaO_3$ as a working substrate. BrewerBOND® 701 (available from Brewer Sciences, Inc. (Rolla, MO)) was used as a photo-release layer in each of the samples.

Figure 10:
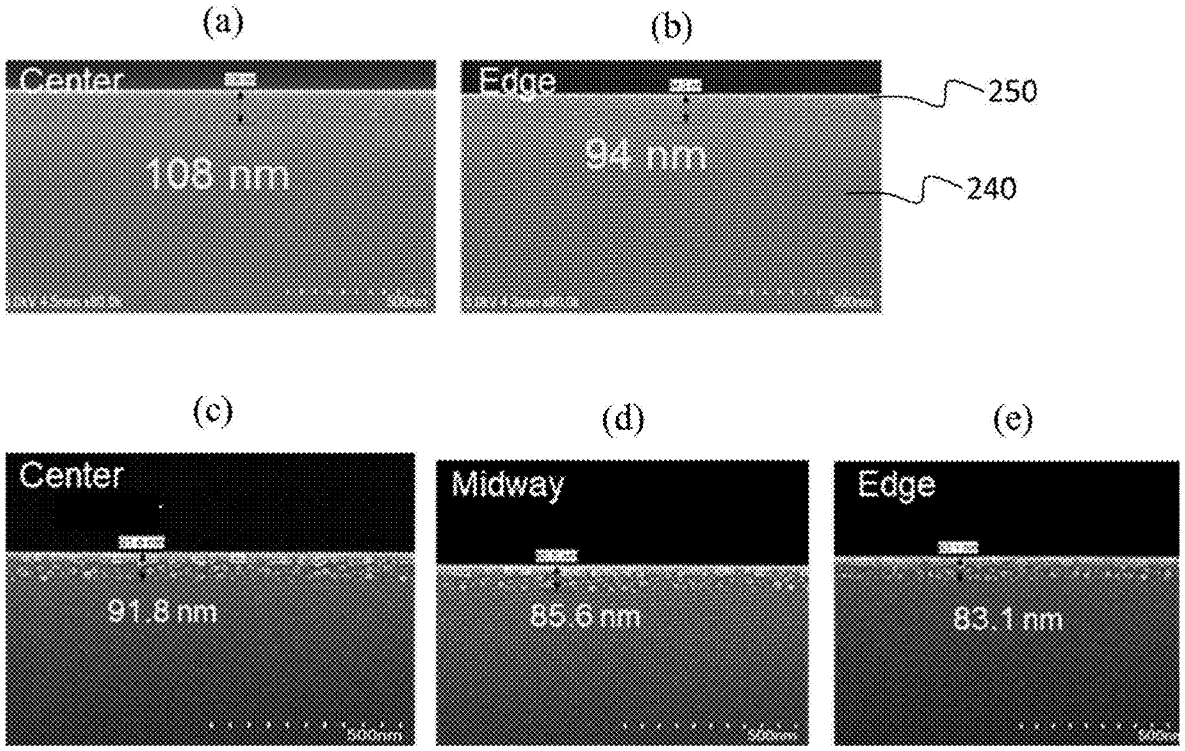
FIG. 10 shows cross-sectional images of an article including a photo-release layer disposed on a carrier substrate.

To apply the photo-release layer, the SG 3.4 carrier wafer of each sample was first wetted with cyclopentanone by spin coating at 1000 rpm for 10 sec. The photo-release layer was then spin coated on the SG 3.4 carrier wafer at 2500 rpm for 35 sec and heated at 300° C. in air to cure and remove solvent. The time of heating was 6 min for Samples 1, 3, and 5, and 4.6 hr (hours) for Samples 2 and 4. FIG. 10 shows cross-sectional SEM images of an SG 3.4 carrier wafer with the photo-release layer after heating. The carrier wafer is designated with label 240 and the photo-release layer is designated with label 250, which are expressly depicted in image (b) of FIG. 10 and which labels apply analogously to all images of FIG. 10. Images (a) and (b) of FIG. 10 show the thicknesses of photo-release layer 250 at center and edge positions, respectively, after heating for 6 min at 300° C. The center thickness was 108 nm and the edge thickness was 94 nm. The total thickness variation (TTV) of photo-release layer 250 was <20 nm. Images (c), (d) and (e) of FIG. 10 show the thicknesses of photo-release layer 250 at center, midway, and edge positions, respectively, after heating for 4.6 hr (hours) at 300° C. The longer heating time led to an increase in grain size of the photo-release layer. The center thickness was 91.8 nm, the midway (halfway between edge and center) thickness was 85.6 nm, and the edge thickness was 83.1 nm. The total thickness variation (TTV) of photo-release layer 250 was <20 nm.

Figure 11:
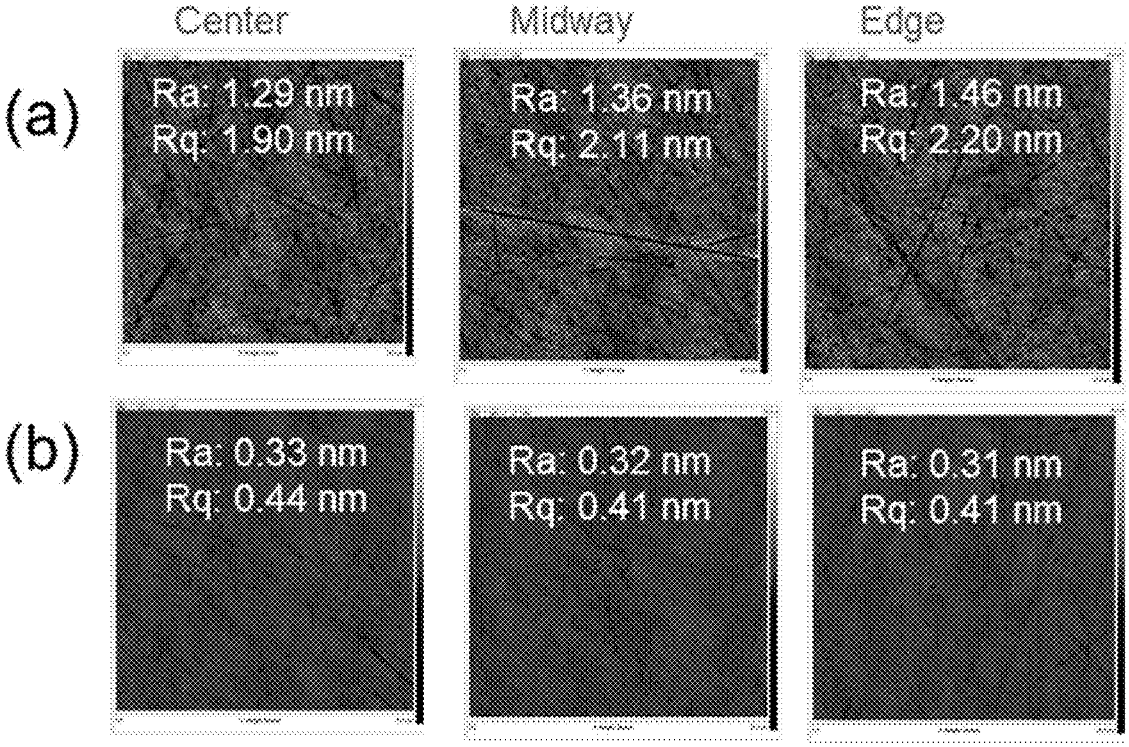
FIG. 11 shows images surface images of a carrier substrate and a photo-release layer disposed on a carrier substrate.

FIG. 11 shows AFM images of (a) the surface of the carrier substrate and (b) the surface of the photo-release layer after heating for 4.6 hr at 300° C. on the carrier substrate at center, midway and edge positions. The roughness values $R_a$ and $R_q$ are indicated at each position. The images show that application of the photo-release layer reduces the surface roughness. The roughness of the surface of the carrier substrate is a consequence of the polishing needed to reduce the total thickness variation (TTV) of the carrier substrate. Application of the photo-release layer covers grooves, depressions, etc. caused by polishing of the surface of the carrier substrate to provide a smoother surface. The reduction in roughness may facilitate bonding of the working substrate and may contribute to an increase in bonding energy.

After heating, the photo-release layers of Samples 3, 4, and 5 were treated with an $O_2$ plasma (150 W-300 W for 30 sec at an $O_2$ flow rate of 50 sccm). No plasma treatment of the photo-release layer of Samples 1 and 2 was completed. The working substrate of each sample was then contacted to the photo-release layer and bonded to the carrier substrate within 60 min of plasma treatment. Bonding was accomplished by a fast wave propagation technique in which the working substrate and carrier substrate were contacted. Force was applied at the center of the substrates to form a center bond and a bonding front that propagated from the center to the edges of the substrates within 30 seconds. After bonding, a laminator was used to squeeze Samples 1-4 to remove bubbles. Due to the fragility of $LiTaO_3$, the laminator was not applied to Sample 5. Instead, manual pressing by hand was used to squeeze out bubbles. After removing bubbles, the plasma-treated samples (Samples 3, 4, and 5) were annealed at 80° C. for 12 hr. The bonding energy of each sample was then measured. The configurations and the measured bonding energies of each Sample are summarized in Table 1. In Table 1, the column labelled "Heating Time" refers to the time of heating of the photo-release layer and the column labelled "Plasma Treatment" indicates whether the photo-release layer was treated with a plasma.

TABLE 1

| Sample | Carrier Substrate | Working Substrate | Heating Time | Plasma Treatment | Bonding Energy (mJ/m$^2$) |
|---|---|---|---|---|---|
| 1 | SG 3.4 | SG 3.4 | 6 min | No | 137 ± 69 |
| 2 | SG 3.4 | SG 3.4 | 4.6 hr | No | 137 ± 69 |
| 3 | SG 3.4 | SG 3.4 | 6 min | Yes | 475 – 693 |
| 4 | SG 3.4 | SG 3.4 | 4.6 hr | Yes | 1299 ± 139 |
| 5 | SG 3.4 | $LiTaO_3$ | 6 min | Yes | 475 – 745 |

Samples 1 and 2 were comparative examples in which no plasma treatment occurred. The bonding energy observed for Samples 1 and 2 was low and indicates weak bonding of the working substrate to the carrier substrate. A comparison of Samples 1 and 2 indicates that extended heating times for the photo-release layer had no significant effect on bonding energy. Samples 3 and 4 are counterparts to Samples 1 and 2 in which the photo-release layer was treated with a plasma. Plasma treatment led to a significant increase in bonding energy and the increase in bonding energy became more pronounced as the heating time of the photo-release layer was increased.

This example show that plasma treatment of the photo-release layer provides high bonding strength between a carrier substrate and a working substrate with a bonding structure having low thickness and low total thickness variation (TTV).

Example 2

This example demonstrates an increase in bonding energy of a bonding structure that includes a photo-release layer and an adhesive upon plasma treatment of the photo-release layer. Four samples (Samples 6, 7, 8, and 9) are described. The carrier substrate of each sample was a polished SG 3.4 glass with dimension of 150 mm in diameter and TTV below 0.2 micron and the working substrate of each sample was a fusion-drawn SG3.4 glass with dimension of 150 mm in diameter and TTV below 2 microns. For Samples 6, 7, and 8, a photo-release layer was formed on the carrier substrate using the method described in EXAMPLE 1 with heating for 4.6 hr 300° C. The average thickness of the photo-release layer was 100 nm. BrewerBOND® 701 (available from Brewer Sciences, Inc. (Rolla, MO)) was used as the photo-release layer. Sample 9 was a control sample that did not include a photo-release layer.

An adhesive was applied to a surface of the working substrate. The adhesive included alternating adhesion layers of a cationic polymer and an anionic polymer. The cationic polymer adhesion layer was PDADMAC (poly(diallyldimethylammonium chloride) (see formula (I) above)) and the anionic adhesion layer was PSS (poly(sodium-4-styrene sulfonate)) (see formula (VI) above). Liquid precursors of the cationic polymer and anionic polymer were used to apply the adhesion layers. The concentration of the cationic polymer in its liquid precursor was 0.1 wt %, which was obtained by dilution of a 20 wt % solution of PDADMAC (available from Sigma Aldrich). The cationic polymer had a molecular weight of 400,000-500,000 g/mol. The concentration of anionic polymer in its liquid precursor was 0.1 wt %, which was obtained by dilution of a 30 wt % solution of PSS (available from Sigma Aldrich). The PSS had a molecular weight of 200,000 g/mol. The viscosity of the two liquid precursors was approximately 0.01 poise. The cationic polymer and anionic polymer were applied by spin coating the liquid precursors onto the surface of the working substrate. The conditions of spin coating were 30 sec at 300 rpm, followed by 1 min at 2000 rpm. The cationic polymer adhesion layer was applied first and was in direct contact with the surface of the working substrate. The anionic polymer adhesion layer was then applied to the surface of the cationic adhesion layer. Formation of the adhesive continued by alternating cationic polymer adhesion layers with anionic polymer adhesion layers. After application of each adhesion layer, excess polymer solution was removed by spin-rinsing with deionized water (30 seconds at 300 rpm; 1 minute at 2000 rpm).

Working substrates with different numbers of alternating cationic polymer adhesion layers and anionic polymer adhesion layers were prepared to vary the thickness of the adhesive. Sample 6 included a working substrate with one cationic polymer adhesion layer and no anionic polymer adhesion layer. Sample 7 included a working substrate with three alternating adhesion layers in the sequence cationic-anionic-cationic. Sample 8 and Sample 9 included a working substrate with seven alternating adhesion layers in the sequence cationic-anionic-cationic-anionic-cationic-anionic-cationic. The average thicknesses, estimated by ellipsometry, of the adhesives for Samples 6, 7, and 8 were 2.1 nm, 4.0 nm, and 8.8 nm, respectively.

The working substrate with adhesive and the carrier substrate with (Samples 6, 7, and 8) or without (Sample 9) the photo-release layer were then bonded. Before bonding, the photo-release layer (Samples 6, 7, and 8) was treated with an $O_2$ plasma (150 W-300 W for 30 sec with an $O_2$ flow rate of 50 sccm). No plasma treatment of Sample 9 occurred. Bonding was accomplished using the procedure described in EXAMPLE 1 by contacting the adhesive surface of the working substrate to the plasma-treated photo-release layer (Samples 6, 7, and 8) or the surface (Sample 9) of the carrier substrate. After bonding, the samples were annealed. Trials of each sample under different annealing conditions were completed. The annealing conditions included annealing temperatures of 80° C. and 235° C. for annealing times up to 48 hours (2880 minutes).

Bonding energy was measured for each sample at selected times during the annealing trials. Selected results are shown in Tables 2 and 3. Bonding energies are listed in units of $mJ/m^2$ and annealing times are listed in minutes. The bonding energy of Sample 7 was not determined at 80° C. Entries for the annealing time of "0 minutes" correspond to the bonding energy of the sample before annealing.

TABLE 2

Bonding Energy at Selected Times upon Annealing at 80° C.

| Sample | Annealing Time (minutes) 0 | 60 | 300 | 720 |
|---|---|---|---|---|
| 6 | 1124 | 1052 | 1664 | 1105 |
| 8 | 1962 | 1915 | 2440 | 2358 |
| 9 | 1146 | 2314 | 2704 | 2439 |

TABLE 3

Bonding Energy ($mJ/m^2$) at Selected Times upon Annealing at 235° C.

| Sample | Annealing Time (minutes) 0 | 60 | 300 | 2880 |
|---|---|---|---|---|
| 6 | 1124 | 1482 | 1648 | 1482 |
| 7 | 1326 | 2804 | 2713 | 3299 |
| 8 | 1962 | 4429 | 4229 | 4440 |
| 9 | 1146 | 4040 | 3525 | 3388 |

The results indicate that bonding energy generally increases with (1) an increase in the number of adhesion layers; (2) annealing temperature; and (3) annealing time. Of particular interest is a comparison of Samples 8 and 9. Samples 8 and 9 include the same adhesive and differ in that Sample 8 includes a plasma-treated photo-release layer, while Sample 9 has no photo-release layer. Upon annealing at 80° C., the presence of the plasma-treated photo-release layer led to a decrease in bonding energy. When the annealing temperature was increased to 235° C., however, the presence of the plasma-treated photo-release layer led to an increase in bonding energy.

Example 3

This example illustrates debonding of a photo-release layer in a sample with a bonding structure that includes an adhesive. Two samples are considered (Sample 10 and Sample 11). Polished SG3.4 with dimension of 150 mm in diameter and TTV below 0.2 micron was used as the carrier substrate for Samples 10 and 11. Fusion-drawn SG3.4 with dimension of 150 mm in diameter and TTV below 2 um was used as the working substrate for Samples 10 and 11. A photo-release layer (BrewerBOND® 701 (available from Brewer Sciences, Inc. (Rolla, MO)) was formed on the surface of the carrier substrate of Sample 10 using the method described in EXAMPLE 2. No photo-release layer was formed on the surface of the carrier substrate of Sample 11. An adhesive was formed on the working substrates of Sample 10 and 11. The adhesive corresponded to the one described in EXAMPLE 2 for Samples 8 and 9.

The working substrate with adhesive and the carrier substrate with (Sample 10) or without (Sample 11) the photo-release layer were then bonded. Before bonding, the photo-release layer (Sample 10) was treated with an $O_2$ plasma (150 W-300 W for 30 sec with an $O_2$ flow rate of 50 sccm). No plasma treatment of Sample 11 occurred. Bonding was accomplished using the procedure described in EXAMPLE 1 by contacting the adhesive surface of the working substrate to the plasma-treated photo-release layer (Sample 10) or the surface (Sample 11) of the carrier substrate. After pressing, Samples 10 and 11 were annealed at 235° C. for 48 hours. Bonding energies of 4546 $mJ/m^2$ and 2170 $mJ/m^2$ were measured for Samples 10 and 11, respectively.

The extinction coefficient measured for BrewerBOND® 701 on high purity fused silica at various wavelengths in the UV (ultraviolet) is shown in Table 4. To obtain the extinction coefficients, BrewerBOND® 701 was applied by spin coating onto the high purity fused silica substrate and curing for 6 min at 300° C. The thickness of the layer of BrewerBOND® 701 was 90 nm-100 nm.

TABLE 4

| Extinction Coefficient (k) of BrewerBOND ® 701 | |
|---|---|
| Wavelength (nm) | k |
| 248 | 0.471 |
| 308 | 0.140 |
| 355 | 0.029 |

High values for the extinction coefficient of BrewerBOND® 701 were observed and indicate that appreciable absorption of light energy by the photo-release layer of Sample 10 is expected at wavelengths in the UV. The extinction coefficient of the adhesive used in Samples 10 and 11, in contrast, is expected to be less than 0.0001 at visible and UV wavelengths. As a result, absorption of the light energy by the adhesive of Samples 10 and 11 is expected to be negligible.

Samples 10 and 11 were exposed to a nanosecond pulse laser in a debonding test. The laser had a wavelength of 355 nm, a power of 4 W-6 W, and was directed to the bonding structures of Samples 10 and 11. Debonding of the carrier substrate and working substrate of Sample 10 occurred readily. No debonding occurred for Sample 11. The bonding energy of Sample 11 was measured after exposure to the laser and was found, within experimental uncertainty, to be the same as the bonding energy before exposure to the laser.

Example 4

This example demonstrates an increase in bonding energy that occurs upon plasma treatment of a photo-release layer. The substrate materials selected for this example were SG 3.4 (a silicate glass wafer available from Corning Incorporated) and a $LiTaO_3$ wafer (available from Yamaju Ceramics Co., Ltd). The SG 3.4 substrate had dimensions of 150±0.2 mm in diameter with TTV below 0.2 micron. The $LiTaO_3$ substrate had dimensions of 150±0.2 mm in diameter with TTV below 1.5 micron. One sample was considered. The sample included the SG 3.4 substrate as the carrier substrate and the $LiTaO_3$ substrate as the working substrate. BrewerBOND® 701 (available from Brewer Sciences, Inc. (Rolla, MO)) was used as a photo-release layer. To apply the photo-release layer, the SG 3.4 carrier wafer of each sample was first wetted with cyclopentanone by spin coating at 1000 rpm for 10 sec. The photo-release layer was then spin coated on the SG 3.4 carrier wafer at 2500 rpm for 35 sec and heated at 300° C. in air to cure and remove solvent. The time of heating was 6 min.

After heating, the photo-release layer was treated with an $O_2$ plasma (150 W-300 W for 30 sec at an $O_2$ flow rate of 50 sccm). The $LiTaO_3$ substrate was then contacted to the photo-release layer and bonded to the carrier substrate within 60 min of plasma treatment. Bonding was accomplished by a fast wave propagation technique in which the $LiTaO_3$ substrate and SG3.4 substrate were contacted. Force was applied at the center of the substrates to form a center bond and a bonding front propagated that from the center to the edges of the substrates within 30 seconds. After bonding, manual pressing by hand was used to squeeze out bubbles. After removing bubbles, the sample was annealed at 80° C. for 12 hr. The bonding energy of the sample was then measured as described in EXAMPLE 1 above and determined to be in the range of 475 $mJ/m^2$ to 745 $mJ/m^2$. The sample was then subjected to a nanosecond pulse laser and successfully debonded. The wavelength of the laser was 355 nm and the laser energy applied to the sample was estimated to be 550 mJ-1250 mJ.

Example 5

This example demonstrates an increase in bonding energy that occurs upon plasma treatment of a photo-release layer. The substrate materials selected for this example were SG 3.4 (a silicate glass wafer available from Corning Incorporated) and a $LiTaO_3$ wafer (available from Yamaju Ceramics Co., Ltd). The SG 3.4 substrate had dimensions of 150±0.2 mm in diameter with TTV below 0.2 micron. The $LiTaO_3$ substrate had dimensions of 150±0.2 mm in diameter with TTV below 1.5 micron. Four samples based on the substrates were considered. Samples 12, 13, and 14 used SG 3.4 as both a carrier substrate and a working substrate. Sample 15 used SG 3.4 as a carrier substrate and $LiTaO_3$ as a working substrate. SPIS-TA-401S (available from Shin Etsu Chemical Co., Ltd. (Tokyo, JP)) was used as a photo-release layer in each of the samples. SPIS-TA-401S is a melamine-based solution that includes propylene glycol methyl ether acetate (CAS No. 108-65-6), cyclopentanone (CAS No. 120-92-3), tris[bis(methoxymethyl)amino]-1,3,5-triazine] (CAS No. 3089-11-0), silane groups, and benzene in approximate proportions of ≤70:≤30:≤5:≤5:≤5. Tris[bis(methoxymethyl)amino]-1,3,5-triazine] is a melamine compound. When cured, SPIS-TA-401S forms a photo-release layer consisting primarily of tris[bis(methoxymethyl)amino]-1,3,5-triazine], silane groups, and benzene or compounds or polymers derived therefrom.

Figure 12:
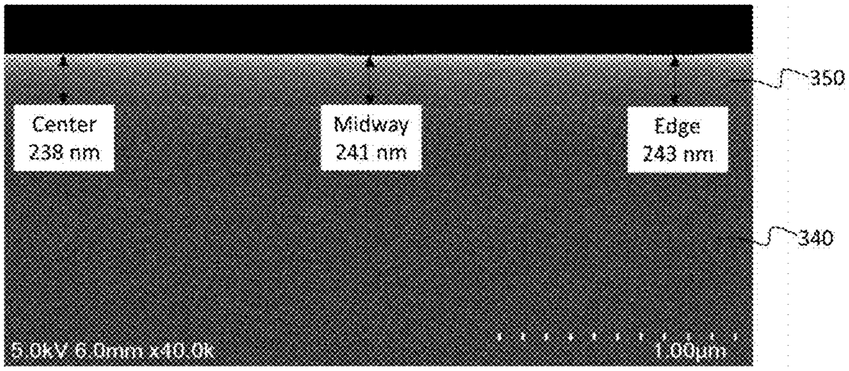
FIG. 12 shows cross-sectional images of an article including a photo-release layer disposed on a carrier substrate.

To form the photo-release layer, the SG 3.4 carrier wafer of each sample was first wetted with cyclopentanone by spin coating at 1000 rpm for 10 sec. The solution of the photo-release layer was next spin coated on the SG 3.4 carrier wafer of each sample at 5000 rpm for 120 sec, pre-heated at 130° C. in air for 90 s and then heated at 250° C. in air for 10 min to cure and remove solvent to form the photo-release layer. FIG. 12 shows cross-sectional SEM images of an SG 3.4 carrier wafer with the photo-release layer after curing. The carrier wafer is designated with label 340 and the photo-release layer is designated with label 350. FIG. 12 shows the thicknesses of photo-release layer 350 at center, midway, and edge positions after curing. The center thickness was 238 nm, the midway (halfway between edge and center) thickness was 241 nm, and the edge thickness was 243 nm. The total thickness variation (TTV) of photo-release layer 350 was <20 nm.

After heating, the photo-release layers of Samples 13, 14, and 15 were treated with an $O_2$ plasma (75 W for 30 sec at an $O_2$ flow rate of 50 sccm and pressure of 200 mTorr). No plasma treatment of the photo-release layer of Sample 12 was completed. The working substrate of each sample was then contacted to the photo-release layer and bonded to the carrier substrate within 60 min of plasma treatment. Bonding was accomplished by a fast wave propagation technique in which the working substrate and carrier substrate were contacted. Force was applied at the center of the substrates to form a center bond and a bonding front that propagated from the center to the edges of the substrates within 30 seconds. Alternatively, force can be applied to the edge of the substrate to form an edge bond and a bonding front that propagates from one edge to another edge within 30 seconds. Bonding of Samples 12, 13, and 15 was performed at room temperature, while bonding of Sample 14 occurred at 60° C. After bonding, a laminator was used to squeeze Samples 1-4 to remove bubbles. Due to the fragility of $LiTaO_3$, the laminator was not applied to Sample 15. Instead, manual pressing by hand was used to squeeze out bubbles. The bonding energy of each sample was then measured without annealing. The configurations and the measured bonding energies of each Sample are summarized in Table 5. In Table 5, the column labelled "Heating Time" refers to the time of heating of the photo-release layer and the column labelled "Plasma Treatment" indicates whether the photo-release layer was treated with a plasma.

TABLE 5

| Sample | Carrier Substrate | Working Substrate | Plasma Treatment | Bonding Energy ($mJ/m^2$) |
|---|---|---|---|---|
| 12 | SG 3.4 | SG 3.4 | No | 309 ± 11 |
| 13 | SG 3.4 | SG 3.4 | Yes | 480 ± 33 |
| 14 | SG 3.4 | SG 3.4 | Yes | 4895 ± 247 |
| 15 | SG 3.4 | $LiTaO_3$ | Yes | 5604 ± 1027 |

Sample 12 was a comparative example in which no plasma treatment occurred. The bonding energy observed for Sample 12 was low and indicates weak bonding of the working substrate to the carrier substrate. Sample 13 was a counterpart to Sample 12 in which the photo-release layer was treated with a plasma. Sample 14 was a counterpart to Sample 12 in which the photo-release layer was treated with a plasma and bonding occurred at high temperature (60° C.) instead of room temperature. Plasma treatment led to a significant increase in bonding energy and bonding at high temperature led to a further increase in bonding energy. Sample 15 illustrates high bonding energy when using $LiTaO_3$ as a working substrate upon plasma treatment of the photo-release layer. Additional trials on samples corresponding to Samples 12, 13, and 14 in which bonding was followed by annealing at 80° C. for 12 hr were completed. The effect of annealing on bonding energy was small and that high bonding energies were achievable with the photo-release layer without annealing.

Figure 13:
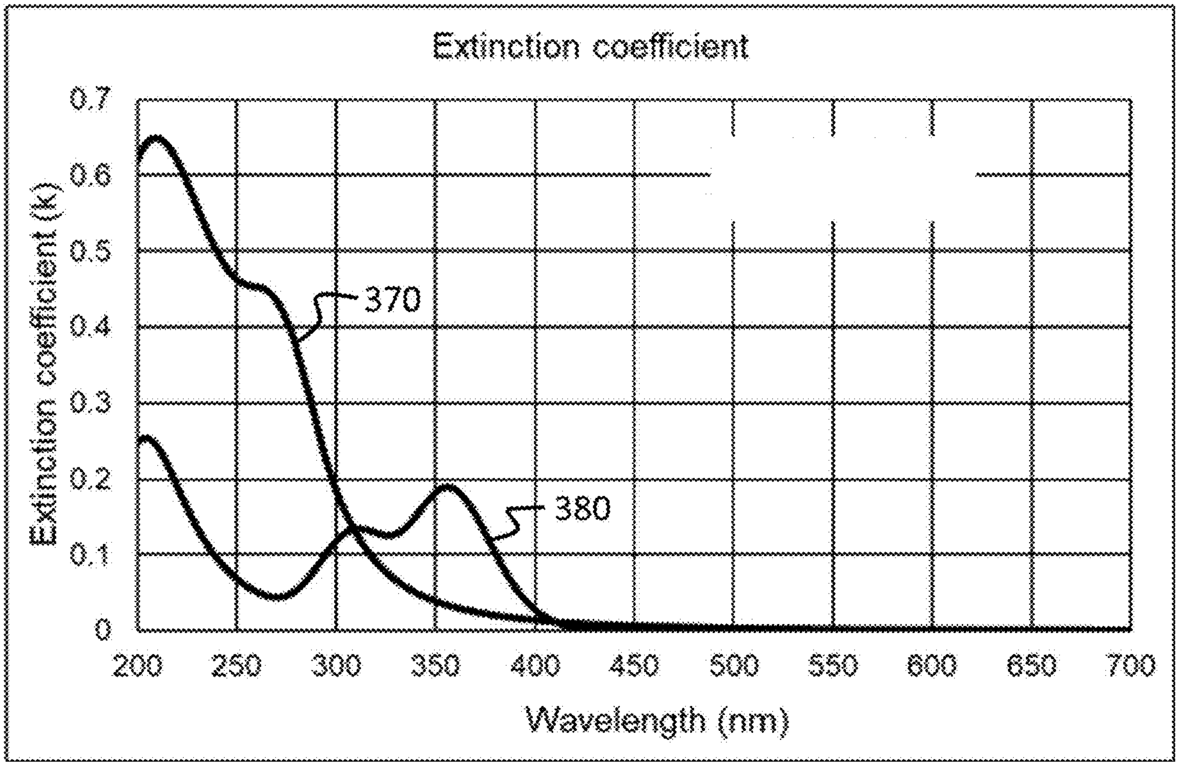
FIG. 13 shows the dependence of extinction coefficient on wavelength for selected photo-release layers.

FIG. 13 compares the extinction coefficients of two different photo-release layers as a function of wavelength. Trace 370 shows the extinction coefficient of a 110 nm thick photo-release layer made from BrewerBOND® 701 and Trace 380 shows the extinction coefficient of a 250 nm thick photo-release layer made from SPIS-TA-401S. The results indicate a higher extinction coefficient for SPIS-TA-401S at wavelengths above about 300 nm and a higher extinction coefficient for BrewerBOND® 701 at wavelengths below about 300 nm. Experiments performed on Sample 15 showed that debonding was successfully completed at powers as low as 1.8 W using nanosecond pulse laser operating at a wavelength of 355 nm and a spot size of 37 μm.

This example show that plasma treatment of the photo-release layer provides high bonding strength between a carrier substrate and a working substrate with a bonding structure having low thickness and low total thickness variation (TTV).

It will be apparent to those skilled in the art that various modifications and variations can be made to the disclosed embodiments without departing from the spirit and scope of the disclosure. Thus, it is intended that the present disclosure cover any and all such modifications and variations as come within the scope of the appended claims and their equivalents.

What is claimed is:

1. An article comprising:

a first substrate;

a second substrate;

a bonding structure disposed between and in direct contact with the first substrate and the second substrate, the bonding structure having an average thickness less than 10.0 microns and providing a bonding energy of the second substrate to the first substrate greater than 200 $mJ/m^2$, the bonding structure comprising a photo-release layer, the photo-release layer having an extinction coefficient greater than 0.010 at a wavelength in the range from 190 nm to 700 nm.

2. The article of claim 1, wherein the first substrate comprises glass.

3. The article of claim 1, wherein the first substrate has a total thickness variation (TTV) less than 3.0 microns.

4. The article of claim 1, wherein the second substrate comprises glass, a semiconductor, or a piezoelectric material.

5. The article of claim 1, wherein the second substrate has an average thickness of 10.0 microns or less.

6. The article of claim 1, wherein the total thickness variation (TTV) of the second substrate is less than 3.0 microns.

7. The article of claim 1, wherein the bonding structure has an average thickness less than 100 nm.

8. The article of claim 1, wherein the bonding structure has a total thickness variation (TTV) less than 100 nm.

9. The article of claim 1, wherein the photo-release layer directly contacts the first substrate and the second substrate.

10. The article of claim 1, wherein the photo-release layer comprises a polyimide, a polyamic acid or a combination thereof.

11. The article of claim 1, wherein the photo-release layer comprises melamine, a compound derived from melamine, a polymer derived from melamine or a combination thereof.

12. The article of claim 1, wherein the photo-release layer has a total thickness variation (TTV) less than 10.0 nm.

13. The article of claim 1, wherein the article has a total thickness variation (TTV) less than 2.0 microns.

14. The article of claim 1, wherein the bonding structure further comprises an adhesive.

* * * * *